United States Patent
Kim

(10) Patent No.: US 11,271,073 B2
(45) Date of Patent: Mar. 8, 2022

(54) SEMICONDUCTOR DEVICE AND METHOD FOR FABRICATING THE SAME

(71) Applicant: SK hynix Inc., Gyeonggi-do (KR)

(72) Inventor: Seung Muk Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/988,276

(22) Filed: Aug. 7, 2020

(65) Prior Publication Data
US 2021/0272959 A1    Sep. 2, 2021

(30) Foreign Application Priority Data
Mar. 2, 2020   (KR) .................. 10-2020-0025900

(51) Int. Cl.
*H01L 49/02*       (2006.01)
*H01L 27/108*      (2006.01)

(52) U.S. Cl.
CPC .......... *H01L 28/60* (2013.01); *H01L 27/1085* (2013.01); *H01L 27/10805* (2013.01)

(58) Field of Classification Search
None
See application file for complete search history.

(56) References Cited

U.S. PATENT DOCUMENTS

| | | | |
|---|---|---|---|
| 8,546,232 B2 | 10/2013 | Sako | |
| 2013/0011988 A1* | 1/2013 | Sako | ................ H01L 27/10852 438/381 |
| 2019/0057967 A1 | 2/2019 | Chang et al. | |

* cited by examiner

*Primary Examiner* — Anthony Ho
*Assistant Examiner* — Kevin Quinto
(74) *Attorney, Agent, or Firm* — IP & T Group LLP

(57) ABSTRACT

A method for fabricating a semiconductor device includes: forming a lower array including a plurality of bottom electrodes over a semiconductor substrate, a supporter supporting the bottom electrodes, and a dielectric layer that is formed over the bottom electrodes and the supporter; forming a gap-fill layer covering side portions of the lower array and an upper portion of the lower array; forming a capping portion covering the upper portion of the lower array over the gap-fill layer; performing a pull-back process of the gap-fill layer to form a gap-fill electrode aligned with the capping portion; and forming a low-resistivity electrode over the gap-fill electrode.

15 Claims, 16 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2020-0025900, filed on Mar. 2, 2020, which is incorporated herein by reference in its entirety.

BACKGROUND

1. Field

Various embodiments of the present invention relate to a semiconductor device and, more particularly, to a semiconductor device including a capacitor and a method for fabricating the same.

2. Description of the Related Art

A top electrode of a capacitor formed in a memory cell region and a contact plug formed in a peripheral circuit region may need to be electrically disconnected from each other. However, as semiconductor devices are miniaturized, the distance between the top electrode and the contact plug of the peripheral circuit region decreases which may cause an electrical short between the top electrode and the contact plug of the peripheral circuit region.

SUMMARY

Embodiments of the present invention are directed to a semiconductor device capable of preventing an electrical short between a contact plug and a top electrode, and a method for fabricating the semiconductor device.

In accordance with an embodiment of the present invention, a method for fabricating a semiconductor device includes: forming a lower array including a plurality of bottom electrodes over a semiconductor substrate, a supporter supporting the bottom electrodes, and a dielectric layer that is formed over the bottom electrodes and the supporter; forming a gap-fill layer covering side portions of the lower array and an upper portion of the lower array; forming a capping portion covering the upper portion of the lower array over the gap-fill layer; performing a pull-back process of the gap-fill layer to form a gap-fill electrode aligned with the capping portion; and forming a low-resistivity electrode over the gap-fill electrode.

In accordance with another embodiment of the present invention, a semiconductor device includes: a peripheral circuit region including a lower level interconnection; a contact plug coupled to the lower level interconnection; and a memory cell region including a multi-level supporter laterally spaced apart from the contact plug, bottom electrodes supported by the multi-level supporter, and a top electrode filling a space between the bottom electrodes, wherein the top electrode includes: a liner electrode that conformally covers the bottom electrodes and the supporter; and a gap-fill electrode including a gap-fill electrode upper portion which is positioned at a higher level than the bottom electrodes to cover the bottom electrodes and the multi-level supporter over the liner electrode, and supporter-side side portions which are thinner than the gap-fill electrode upper portion and close to an edge portion of the multi-level supporter.

These and other features and advantages of the present invention will become apparent to the person with ordinary skill in the art to which the invention belongs from the following figures and detailed description.

DETAILED DESCRIPTION

Figure 1A:
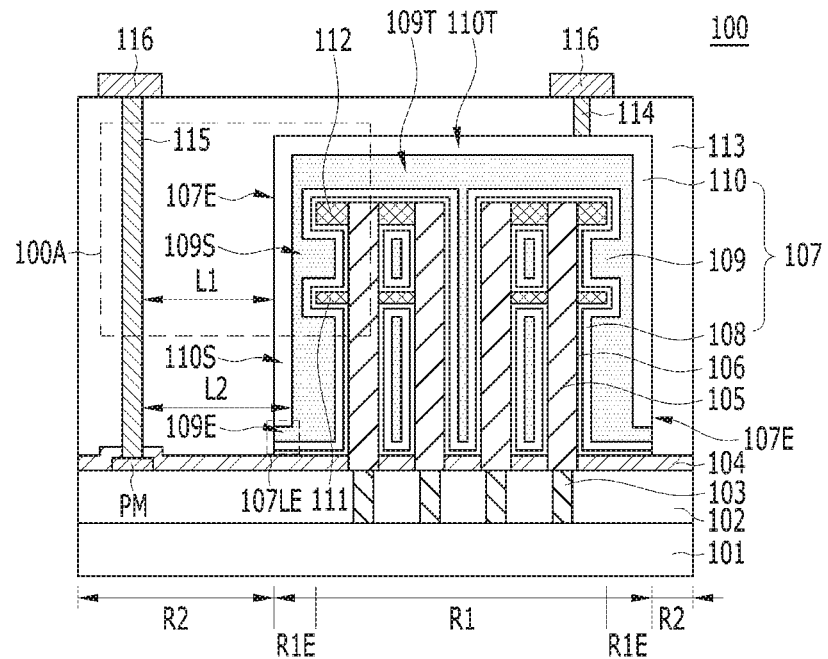
FIG. 1A is a cross-sectional view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. Also, a feature described in one embodiment may be used in combination with one or more features described in another embodiment provided that the combination does not depart from the scope and spirit of the invention as described and claimed.

Figure 1B:
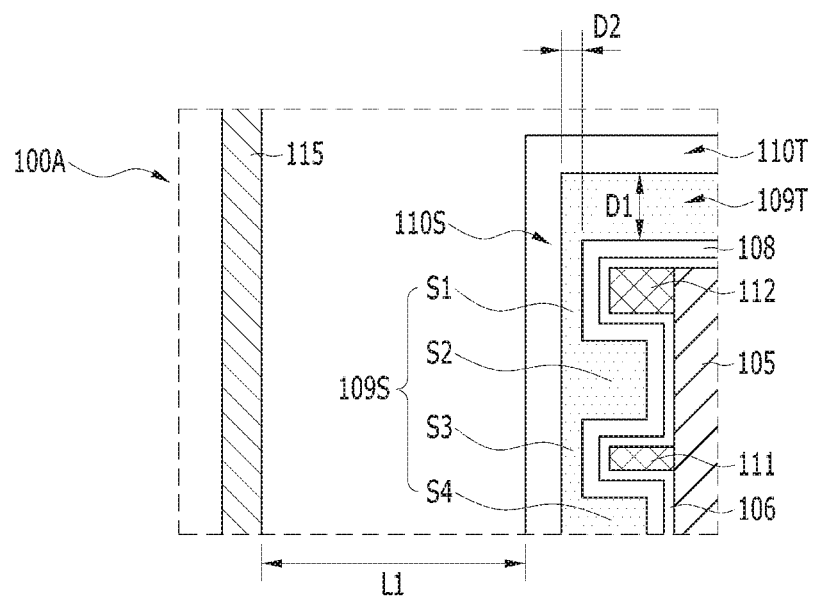
FIG. 1B is an enlarged view of a portion 100A shown in FIG. 1A.

FIG. 1A is a cross-sectional view illustrating a semiconductor device 100 in accordance with an embodiment of the present invention. FIG. 1B is an enlarged view of a portion 100A shown in FIG. 1A.

Referring to FIGS. 1A and 1B, the semiconductor device 100 may include a memory cell region R1 and a peripheral circuit region R2. A plurality of capacitors may be formed in the memory cell region R1. The capacitors may each include a bottom electrode 105, a dielectric layer 106, and a top electrode 107.

A plurality of bottom electrodes 105 may be arranged in the memory cell region R1. Although FIG. 1A shows as an example four bottom electrodes 105, the present disclosure is not limited thereto. Each of the bottom electrodes 105 may be electrically connected to a substrate 101 through a corresponding cell contact plug 103. The cell contact plugs 103 may penetrate through a lower-level inter-layer dielectric layer 102 over the substrate 101 to be coupled to the substrate 101. An etch stop layer 104 may be formed over the lower-level inter-layer dielectric layer 102, and the bottom portion of the bottom electrodes 105 may penetrate through the etch stop layer 104 to be coupled to their respective cell contact plugs 103.

The substrate 101 may be any semiconductor substrate suitable for semiconductor processing. For example, the substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In an embodiment, the substrate 101 may be formed of a semiconductor material containing silicon. In another embodiment, the substrate 101 may include another semiconductor material, such as, for example, germanium. In yet another embodiment, the substrate 101 may be formed of a semiconductor material containing silicon and may also include another semiconductor material such as, for example, germanium. In yet another embodiment, the substrate 101 may include a group III/V semiconductor substrate, for example, a compound semiconductor substrate, e.g., GaAs. In an embodiment, the substrate 101 may include a Silicon-On-Insulator (SOI) substrate.

The lower-level inter-layer dielectric layer 102 may include, for example, silicon oxide. The lower-level inter-layer dielectric layer 102 may be or include, a high density plasma oxide (HDP oxide), TEOS (TetraEthylOrthoSilicate), PE-TEOS (Plasma-Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene), or a combination thereof. In an embodiment, the lower-level inter-layer dielectric layer 102 may include, for example, silicon nitride, silicon oxynitride, or a low-k material having a low dielectric constant.

The cell contact plug 103 may include a semiconductor material, a metal material, or a combination thereof. For example, the cell contact plug 103 may include, for example, polysilicon, tungsten, titanium nitride, titanium silicide, or a combination thereof. According to an embodiment of the present invention, the cell contact plug 103 may be formed by stacking polysilicon, titanium silicide, titanium nitride and tungsten in the mentioned order. Although not illustrated, bit lines may be arranged between the neighboring cell contact plugs 103, and buried word lines may be arranged in the substrate 101. The cell contact plug 103 may also be referred to as a storage node contact plug.

The etch stop layer 104 may have an etch selectivity with respect to the lower-level inter-layer dielectric layer 102. The etch stop layer 104 may include, for example, silicon nitride.

The plurality of bottom electrodes 105 may be supported by one or more supporters 111 and 112. The supporters 111 and 112 may be multi-level supporters, and this embodiment shows a two-level supporter including a lower-level supporter 111 and an upper-level supporter 112. According to another embodiment of the present invention, the supporters 111 and 112 may be multi-level level having three or more levels (or layers). The upper-level supporter 112 may be positioned at a higher level than the lower-level supporter 111. The upper-level supporter 112 may support the upper outer wall of the bottom electrode 105, and the lower-level supporter 111 may primarily support the lower outer wall more than the upper outer wall of the bottom electrode 105. The positions of the upper-level supporter 112 and the lower-level supporter 111 may be variously modified. The lower-level supporter 111 and the upper-level supporter 112 may include a dielectric material. The lower-level supporter 111 and the upper-level supporter 112 may include, for example, silicon nitride, silicon carbon nitride, or a combination thereof. The lower-level supporter 111 and the upper-level supporter 112 may be of the same material or different materials. The lower-level supporter 111 may be thinner than the upper-level supporter 112.

A dielectric layer 106 may be formed to cover the surfaces of the bottom electrodes 105, the lower-level supporter 111, and the upper-level supporter 112, and the top electrode 107 may be formed over the dielectric layer 106. The bottom electrodes 105, the lower-level supporter 111, the upper-level supporter 112, and the dielectric layer 106 may be collectively referred to as a 'lower array'. The lower array may have a structure including an upper portion and side portions on both sides of the upper portion. The lower array may further include an empty space between the bottom electrodes 105 and an empty space between the lower-level supporter 111 and the upper-level supporter 112. The empty spaces of the lower array may be filled with portions of the top electrode 107. The lower array may be formed in the memory cell region R1 and it may not be formed in the peripheral circuit region R2. The top electrode 107 may be positioned in the memory cell region R1 while covering at least the upper and side portions of the lower array. The lower array may also be referred to as a 'capping target structure' that is capped by the top electrode 107.

The top electrode 107 may include a liner electrode 108, a gap-fill electrode 109, and a low-resistivity electrode 110. The liner electrode 108 may be conformally formed over the dielectric layer 106, and the gap-fill electrode 109 may gap-fill the space between the neighboring bottom electrodes 105 over the liner electrode 108, and the low-resistivity electrode 110 may be formed over the gap-fill electrode 109. The gap-fill electrode 109 may be embedded between the liner electrode 108 and the low-resistivity electrode 110.

The bottom electrode 105 may include a conductive material. The bottom electrode 105 may include, for example, polysilicon, a metal, a metal nitride, a conductive metal oxide, a metal silicide, a noble metal, or a combination thereof. The bottom electrode 105 may include at least one among titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt), and combinations thereof. According to another embodiment of the present invention, the bottom electrode 105 may include titanium nitride (TiN). The bottom electrode 105 may include titanium nitride (ALD-TiN) formed by an Atomic Layer Deposition (ALD) process. According to another embodiment of the present invention, the bottom electrode 105 may include a stacked structure of titanium nitride and tungsten. According to another embodiment of the present invention, the bottom electrode 105 may include a stacked structure of titanium nitride and polysilicon.

The dielectric layer 106 may include, for example, silicon oxide or silicon nitride. The dielectric layer 106 may include a high-k material having a higher dielectric constant than silicon oxide. The high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer 106 may be formed as a composite layer including two or more layers of the high-k materials mentioned above. In this embodiment of the present invention, the dielectric layer 106 may be formed of a zirconium oxide-base material having good leakage current characteristics while sufficiently reducing the thickness of an equivalent oxide film (EOT). For example, ZAZ ($ZrO_2/Al_2O_3/ZrO_2$) may be included. According to another embodiment of the present invention, the dielectric layer 106 may include $TiO_2/ZrO_2/Al_2O_3/ZrO_2$, $TiO_2/HfO_2/Al_2O_3/HfO_2$, $Ta_2O_5/ZrO_2/Al_2O_3/ZrO_2$, or $Ta_2O_5/HfO_2/Al_2O_3/HfO_2$.

The liner electrode 108 may include a metal-containing material. The liner electrode 108 may include a metal, a metal nitride, or a combination thereof. According to the embodiment of the present invention, the liner electrode 108 may be formed of a metal nitride, such as titanium nitride.

The gap-fill electrode 109 may include a semiconductor material. The gap-fill electrode 109 may have good step coverage of gap-filling the space between the neighboring bottom electrodes 105 without voids. The gap-fill electrode 109 may include silicon, silicon germanium, silicon carbide, silicon germanium carbide, or a combination thereof. According to the embodiment of the present invention, the gap-fill electrode 109 may be formed, for example, of silicon germanium.

The low-resistivity electrode 110 may include a metal-containing material. The low-resistivity electrode 110 may include a metal, a metal nitride, a metal silicide, or a combination thereof. The low-resistivity electrode 110 may include tungsten, tungsten nitride, tungsten silicide, or a combination thereof. According to the embodiment of the present invention, the low-resistivity electrode 110 may be formed of tungsten nitride.

As an example of the top electrode 107, the stack of the liner electrode 108/the gap-fill electrode 109/the low-resistivity electrode 110 may include a stack of titanium nitride/ silicon germanium/tungsten nitride.

The peripheral circuit region R2 may include a lower level interconnection PM. The lower level interconnection PM may be positioned over the lower-level inter-layer dielectric layer 102 of the peripheral circuit region R2. The lower level interconnection PM may include a metal material. Although not illustrated, the lower level interconnection PM may be coupled to peripheral circuit transistors of the peripheral circuit region R2. The peripheral circuit transistors may include at least one control circuit for controlling memory cells.

An upper-level inter-layer dielectric layer 113 may be formed over the top electrode 107 and the lower level interconnection PM. The upper-level inter-layer dielectric layer 113 may remove the step between the memory cell region R1 and the peripheral circuit region R2. A first contact plug 114 may be formed to penetrate through the upper-level inter-layer dielectric layer 113 of the memory cell region R1, and the first contact plug 114 may be coupled to the low-resistivity electrode 110 of the top electrode 107. A second contact plug 115 may be formed to penetrate through the upper-level inter-layer dielectric layer 113 of the peripheral circuit region R2, and the second contact plug 115 may be coupled to the lower level interconnection PM. The first contact plug 114 and the second contact plug 115 may be coupled to an upper level interconnection 116, individually.

The top electrode 107 may include top electrode edge portions 107E, and the top electrode edge portions 107E may be positioned in edge portions R1E of the memory cell region R1. The top electrode edge portions 107E may be provided by low-resistivity electrode side portions 110S. The low-resistivity electrode side portions 110S may not be positioned in the peripheral circuit region R2. The low-resistivity electrode side portions 110S may be positioned in the edge portions R1E of the memory cell region R1. The top electrode edge portions 107E may include top electrode edge bottom portions 107LE.

The gap-fill electrode 109 may fill the space between the bottom electrodes 105 over the liner electrode 108. The gap-fill electrode 109 may include a gap-fill electrode upper portion 109T and a gap-fill electrode side portions 109S. The gap-fill electrode side portions 109S may extend vertically from the gap-fill electrode upper portion 109T. The gap-fill electrode upper portion 109T may be positioned at a higher level than the bottom electrodes 105, and the gap-fill electrode side portions 109S may have a shape that is retreated by a pull-back process to be laterally spaced apart from the second contact plug 115. The gap-fill electrode side portions 109S may cover side portions of the lower array. The gap-fill electrode upper portion 109T may cover the upper portion of the lower array.

The gap-fill electrode side portions 109S may be positioned in the edge portions R1E on both sides of the memory cell region R1. Referring to FIG. 1B, the gap-fill electrode side portions 109S may include a plurality of gap-fill electrode side portions S1, S2, S3, and S4. The gap-fill electrode side portions S1, S2, S3, and S4 may include a first gap-fill electrode side portion S1, a second gap-fill electrode side portion S2, a third gap-fill electrode side portion S3, and a fourth gap-fill electrode side portion S4. The first gap-fill electrode side portion S1 may cover an edge portion of the upper-level supporter 112, and the third gap-fill electrode side portion S3 may cover an edge portion of the lower-level supporter 112. The second gap-fill electrode side portion S2 may be positioned between the first gap-fill electrode side portion S1 and the third gap-fill electrode side portion S3, and it may be close to a side of an outermost bottom electrode 105 of the memory cell region R1. The fourth gap-fill electrode side portion S4 may be positioned between the third gap-fill electrode side portion S3 and the etch stop layer 104, and it may be close to a side of the outermost bottom electrode 105 of the memory cell region R1. The second gap-fill electrode side portion S2 and the fourth gap-fill electrode side portion S4 may extend from the first gap-fill electrode side portion S1 and the third gap-fill electrode side portion S3, respectively. The fourth gap-fill electrode side portion S4 may be positioned at a lower level than the lower-level supporter 111. The first gap-fill electrode side portion S1 and the third gap-fill electrode side portion S3 may be referred to as a supporter-side edge portion, and the second gap-fill electrode side portion S2 and the fourth gap-fill electrode side portion S4 may be referred to as a bottom electrode-side edge portion.

A thickness D2 of the first and second gap-fill electrode side portions S1 and S3 may be thinner than a thickness D1 of the gap-fill electrode upper portion 109T. The second and fourth gap-fill electrode side portions S2 and S4 may be thicker than the first and third gap-fill electrode side portions S1 and S3. The second and fourth gap-fill electrode side portions S2 and S4 may be thinner than the gap-fill electrode upper portion 109T. According to another embodiment of the present invention, the second and fourth gap-fill electrode side portions S2 and S4 may be the same as or thicker than the thickness of the gap-fill electrode upper portion 109T. The gap-fill electrode side portions 109S may have a vertical profile.

The gap-fill electrode 109 may further include a lateral edge portion 109E extending from the gap-fill electrode side portions 109S to cover the bottom edge of the lower array. The lateral edge portion 109E may extend laterally from the fourth gap-fill electrode side portion S4. A distance L1 between the lateral edge portion 109E and the second contact plug 115 may be shorter than a distance L2 between the first to fourth gap-fill electrode side portions S1, S2, S3, S4 and the second contact plug 115. The top electrode edge bottom portion 107LE may be provided by the lateral edge portion 109E of the gap-fill electrode 109. A distance between the top electrode edge portion 107E and the second contact plug 115 may be the same as the distance L1 between the lateral edge portion 109E of the gap-fill electrode 109 and the second contact plug 115. A distance between the top electrode edge bottom portion 107LE and the second contact plug 115 may be the same as the distance L1 between the lateral edge portion 109E of the gap-fill electrode 109 and the second contact plug 115. An edge portion of the dielectric layer 106 may be positioned below the top electrode edge portion 107LE.

The low-resistivity electrode 110 may include a low-resistivity electrode upper portion 110T covering the gap-fill electrode upper portion 109T and low-resistivity electrode side portions 110S covering the gap-fill electrode side portions 109S.

The lateral edge portion 109E of the gap-fill electrode 109 and the low-resistivity electrode side portions 110S may be self-aligned. In other words, the bottom portion of the low-resistivity electrode side portions 110S may not cover the side of the lateral edge portion 109E of the gap-fill electrode 109.

The low-resistivity electrode 110 may pully cover the gap-fill electrode upper portion 109T and the gap-fill electrode side portions 109S, and an end of the lateral edge portion 109E of the gap-fill electrode 109 may not be covered by the low-resistivity electrode side portions 110S. The thickness of the low-resistivity electrode 110 may be uniform over the gap-fill electrode upper portion 109T and the gap-fill electrode side portions 109S. The low-resistivity electrode 110 may not fill the space between the bottom electrodes 105. For example, the liner electrode 108 and the gap-fill electrode 109 may be positioned over the dielectric layer 106 between the neighboring bottom electrodes 105.

As described above, the gap-fill electrode 109 may cover the side portions and the upper portion of the memory cell region R1 while filling the space between the bottom electrodes 105, and the low-resistivity electrode 110 may cover the side portions and the upper portion of the memory cell region R1 while not filling the space between the bottom electrodes 105. The top electrode edge portion 107LE, that is, the lateral edge portion 109E of the gap-fill electrode 109, the edge portion of the liner electrode 108, and the edge portions of the dielectric layer 106 may be positioned between the bottom portion of the low-resistivity electrode side portions 110S and the etch stop layer 104.

Figure 2A:
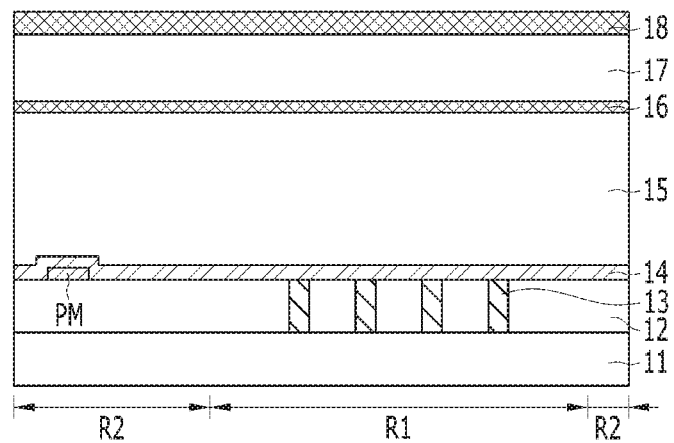
FIGS. 2A to 2P are cross-sectional views illustrating a method for fabricating a semiconductor device in accordance with an embodiment of the present invention.
Figure 2B:
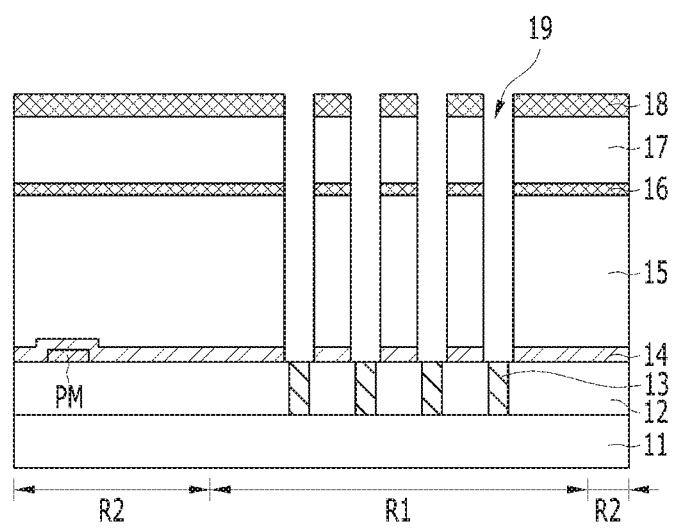
Figure 2C:
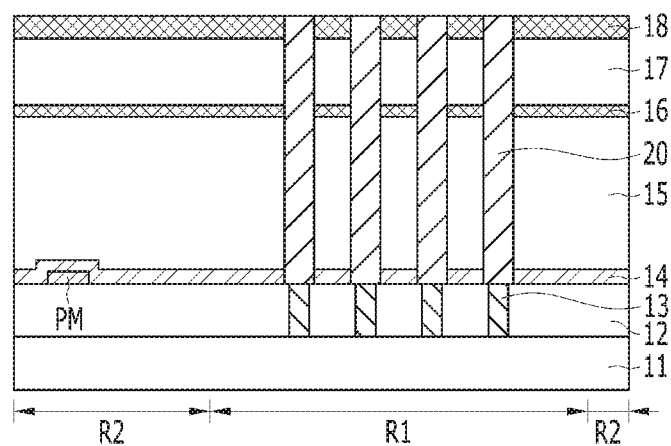
Figure 2D:
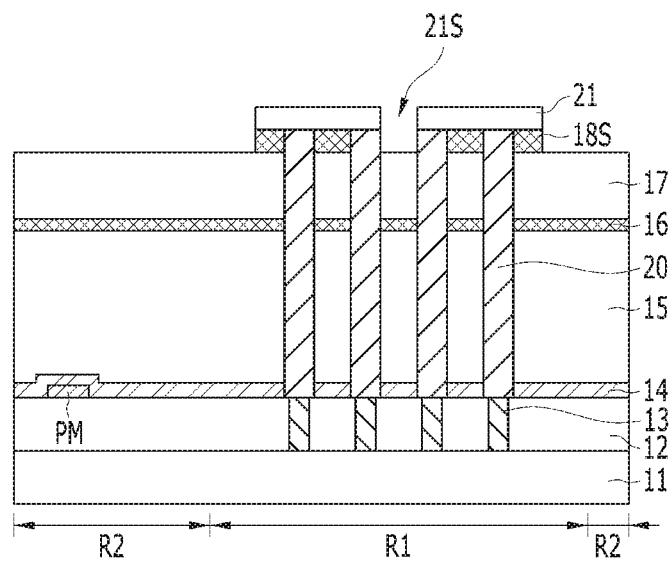
Figure 2E:
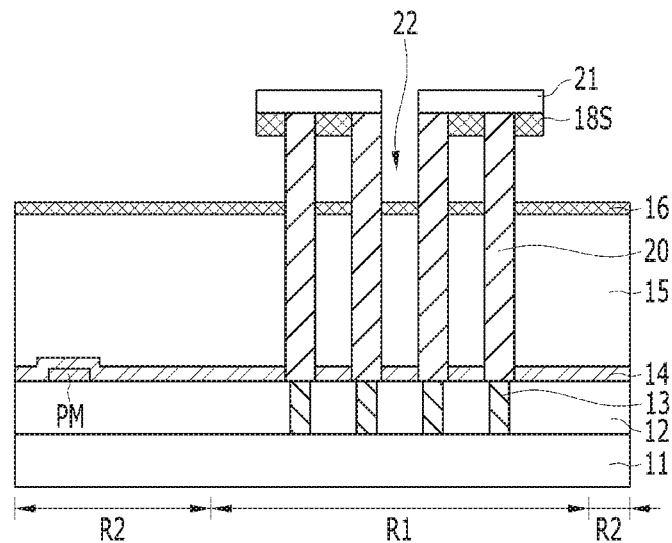
Figure 2F:
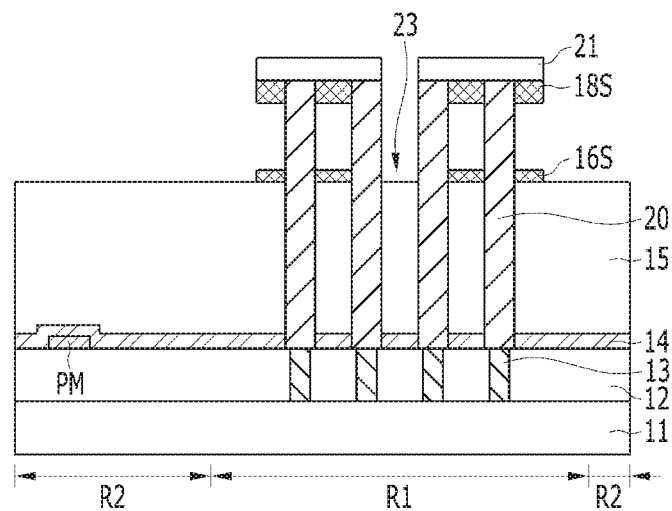
Figure 2G:
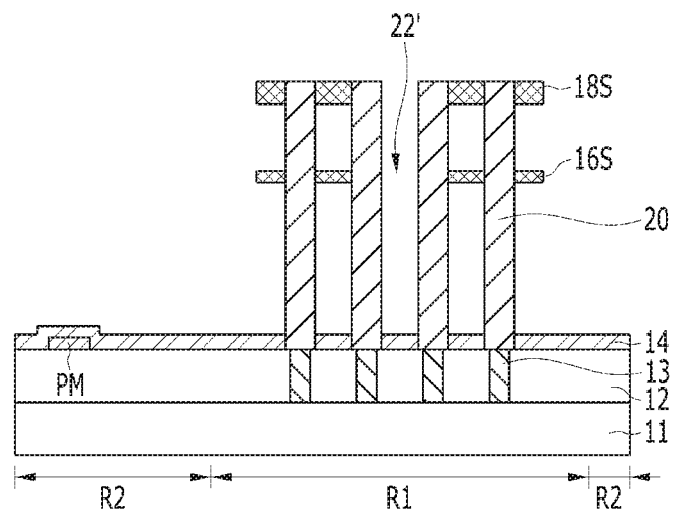
Figure 2H:
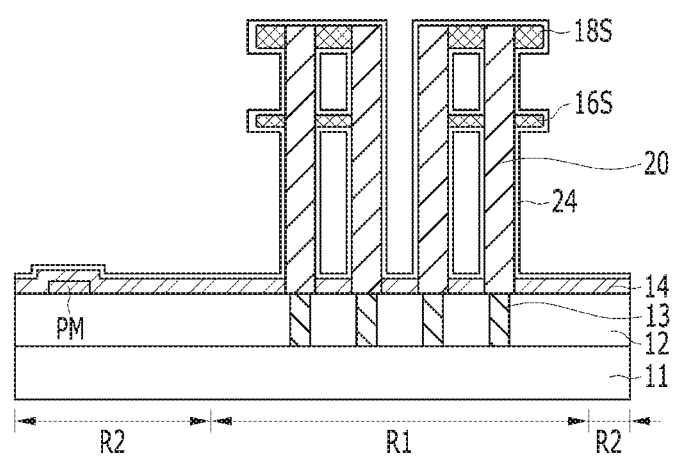
Figure 2I:
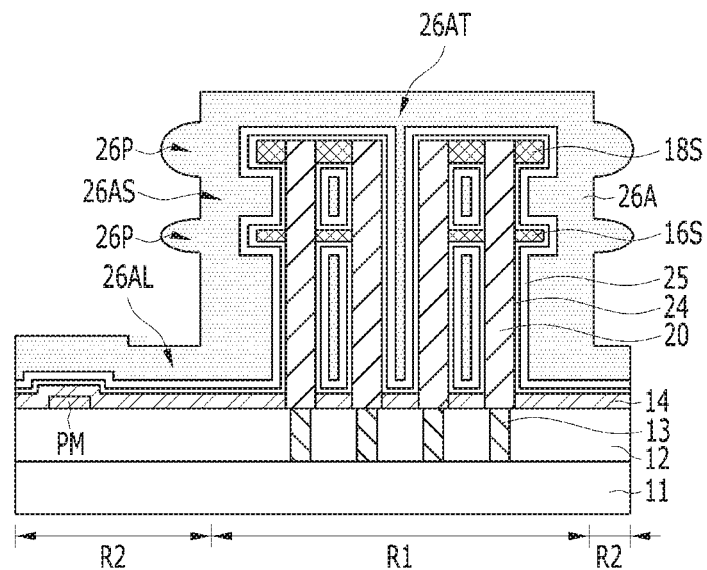
Figure 2J:
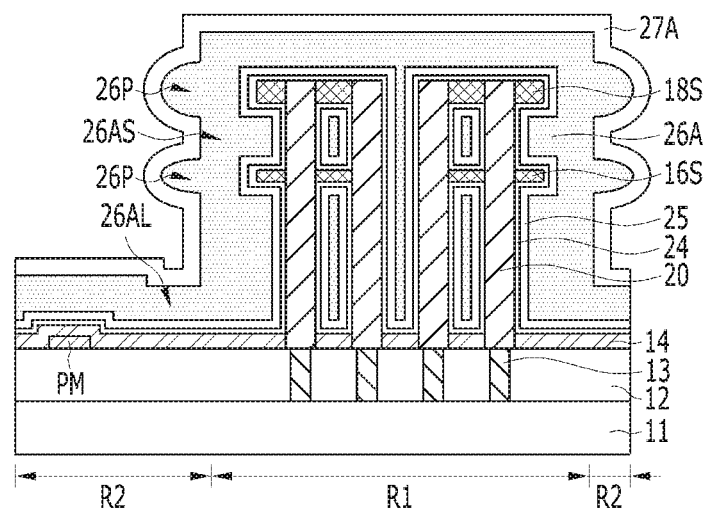
Figure 2K:
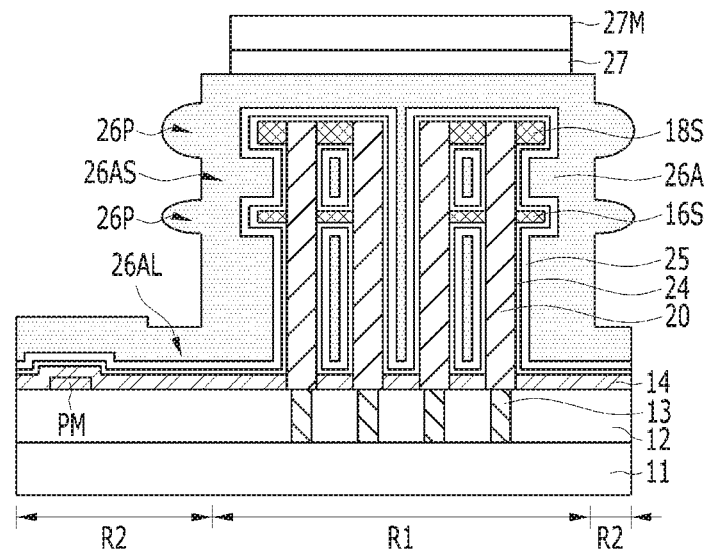
Figure 2L:
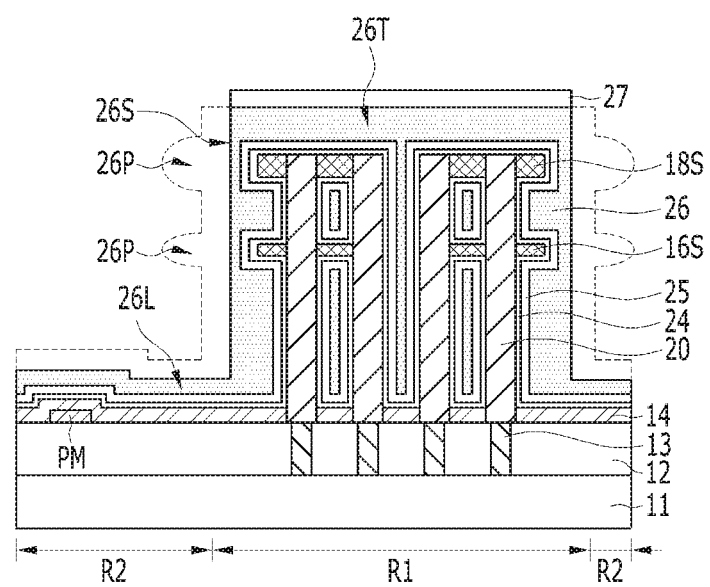
Figure 2M:
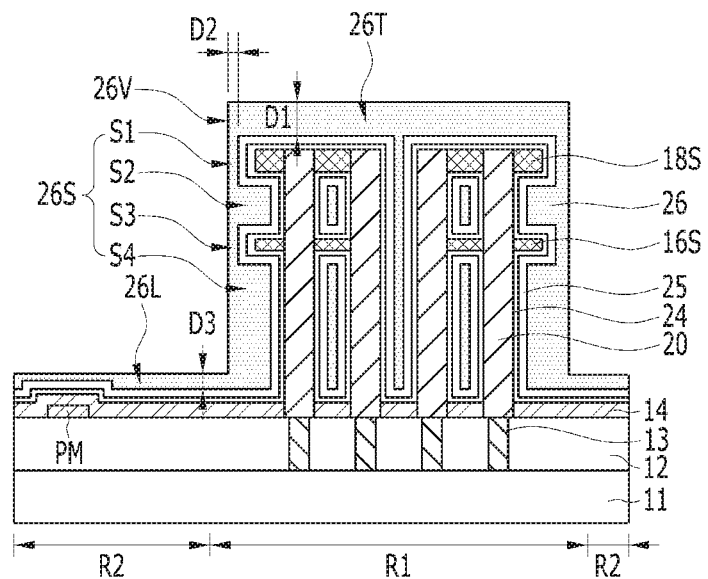
Figure 2N:
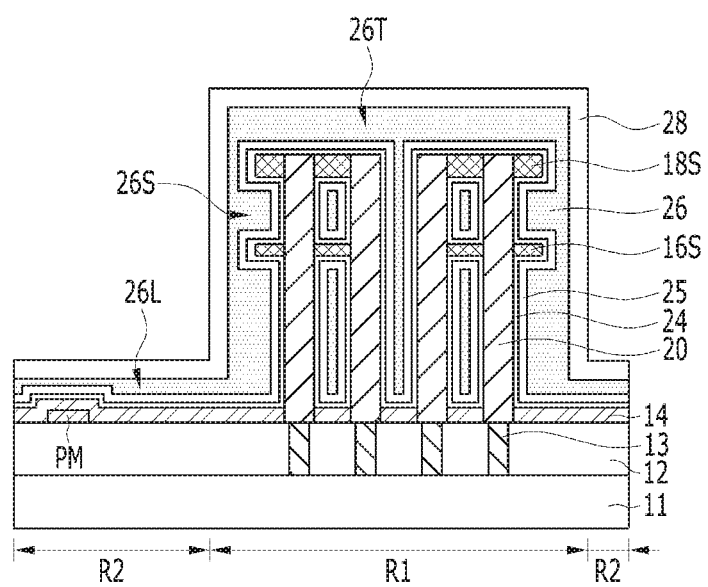
Figure 2O:
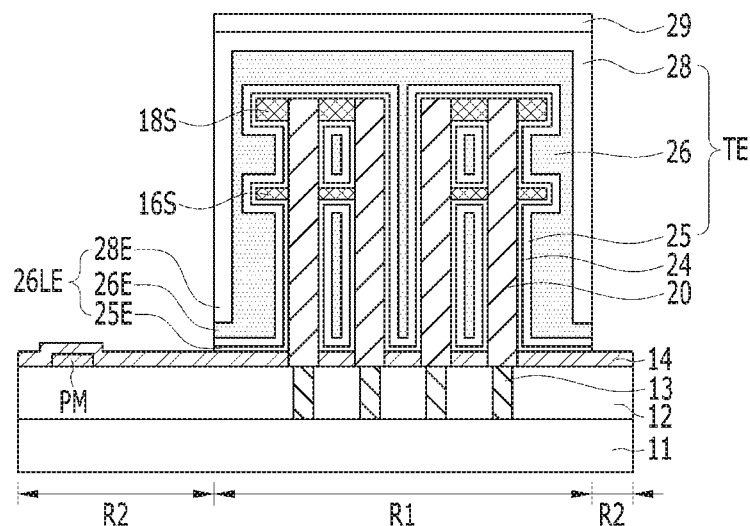
Figure 2P:
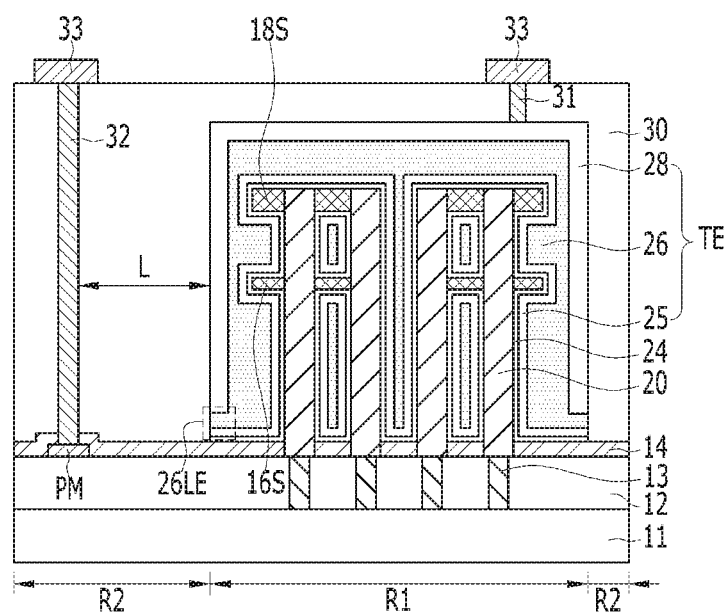

FIGS. 2A to 2P are cross-sectional views illustrating an example of a method for fabricating a semiconductor device in accordance with an embodiment of the present invention.

Referring to FIG. 2A, a lower-level inter-layer dielectric layer 12 may be formed over a semiconductor substrate 11 in which a memory cell region R1 and a peripheral circuit region R2 are defined. A plurality of cell contact plugs 13 penetrating the lower-level inter-layer dielectric layer 12 may be formed. The cell contact plugs 13 may penetrate through the inter-layer dielectric layer 12 to be coupled to the semiconductor substrate 11. The cell contact plugs 13 may include a silicon plug, a metal plug, or a combination thereof. Although not shown, buried word lines may be formed in the semiconductor substrate 11. Before the cell contact plugs 13 are formed, a plurality of bit lines (not shown) may be further formed over the semiconductor substrate 11. The cell contact plugs 13 may each be coupled to a respective impurity region of a plurality of impurity regions (not shown) formed in the semiconductor substrate 11. Although not illustrated in FIG. 2A, the memory cell region R1 may further include edge portions (see 'R1E' in FIG. 1A).

The semiconductor substrate 11 may be any material suitable for semiconductor processing. The semiconductor substrate 11 may be formed of a silicon-containing material. The semiconductor substrate 11 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate 11 may include another semiconductor material, such as germanium. The semiconductor substrate 11 may include a group III/V semiconductor substrate, for example, a compound semiconductor substrate, such as GaAs. The semiconductor substrate 11 may include a Silicon-On-Insulator (SOI) substrate.

The lower-level inter-layer dielectric layer 12 may include, for example, silicon oxide. The lower-level inter-layer dielectric layer 12 may include a high density plasma oxide (HDP oxide), TEOS (TetraEthylOrthoSilicate), PE-TEOS (Plasma Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene), or a combination thereof. Also, the lower-level inter-layer dielectric layer 12 may be formed, for example, of silicon nitride, silicon oxynitride, or a low-k material having a low dielectric constant.

The cell contact plugs 13 may be formed in the memory cell region R1. A lower level interconnection PM may be formed in the peripheral circuit region R2. The lower level interconnection PM may include a metallic material. The lower level interconnection PM may be formed later than the cell contact plugs 13. According to another embodiment of the present invention, a contact pad (not shown) may be further formed over the cell contact plugs 13, and the contact pad and the lower level interconnection PM may be formed at the same time.

A mold structure may be formed over the cell contact plugs 13, the lower level interconnection PM, and the lower-level inter-layer dielectric layer 12. The mold structure may include a stack of an etch stop layer 14, a first mold layer 15, a first support layer 16, a second mold layer 17, and a second support layer 18. The mold structure may be formed over the memory cell region R1 and the peripheral circuit region R2.

The etch stop layer 14 may be formed of a material having an etch selectivity with the lower-level inter-layer dielectric layer 12 and the first mold layer 15. The etch stop layer 14 may include, for example, silicon nitride or silicon oxynitride.

The first mold layer 15 may include a dielectric material. The first mold layer 15 may be silicon oxide (SiO$_2$). The first mold layer 15 may be formed thicker than the first support layer 16. The first mold layer 15 may be formed by a deposition process, such as, for example, Vapor Deposition (CVD), Atomic Layer Deposition (ALD) or Physical Vapor Deposition (PVD). The first mold layer 15 may include an impurity-containing silicon oxide doped with phosphorus or boron. The first mold layer 15 may include USG, PSG, BSG, BPSG, FSG, or a combination thereof. The impurity-containing silicon oxide may be easily removed in a subsequent process because its etching rate with respect to an etching solution is fast.

The first supporter layer 16 may be formed of a material having an etch selectivity with respect to the first mold layer 15 and the second mold layer 17. The first supporter layer 16 may include, for example, silicon nitride or silicon carbon nitride (SiCN).

The second mold layer 17 may include a dielectric material. For example, the second mold layer 17 may be silicon oxide (SiO$_2$). The second mold layer 17 may be formed thicker than the first support layer 16. The second mold layer 17 may be formed by a deposition process such as, for example, vapor deposition (CVD), atomic layer deposition (ALD) or physical vapor deposition (PVD). The second mold layer 17 may include an impurity-containing silicon oxide doped with phosphorus or boron. The second mold layer 17 may include USG, PSG, BSG, BPSG, FSG, or a combination thereof. The impurity-containing silicon oxide may be easily removed in a subsequent process because its etching rate with respect to an etching solution is fast. The first mold layer 15 and the second mold layer 17 may be made of the same material or different materials.

According to another embodiment of the present invention, the first mold layer 15 and the second mold layer 17 may be a silicon material such as amorphous silicon or polysilicon.

The second supporter layer 18 may be formed of a material having an etch selectivity with respect to the second mold layer 17. The second supporter layer 18 may include, for example, silicon nitride or silicon carbon nitride (SiCN).

The first supporter layer 16 and the second supporter layer 18 may be made of the same material or different materials. Both of the first supporter layer 16 and the second supporter layer 18 may be formed, for example, of silicon nitride. According to another embodiment of the present invention, the first supporter layer 16 may be formed, for example, of silicon nitride, and the second supporter layer 18 may be formed, for example, of silicon carbon nitride. The second supporter layer 18 may be thicker than the first supporter layer 16. In an embodiment, the second supporter layer 18 and the first supporter layer 16 may each be thinner than the second mold layer 17.

According to another embodiment of the present invention, another supporter layer may be further formed. For example, the supporter structure may be a multi-level supporter layer structure.

Referring to FIG. 2B, a plurality of openings 19 may be formed. In an embodiment, each of the openings 19 may be formed by using a mask layer (not shown) and etching a mold structure. In order to form the openings 19, the second supporter layer 18, the second mold layer 17, the first supporter layer 16, and the first mold layer 15 may be sequentially etched by using the mask layer as an etch barrier. The etching process for forming the openings 19 may stop at the etch stop layer 14. The openings 19 may be formed by a dry etching process, a wet etching process, or a combination thereof. The openings 19 may be referred to as holes in which respective bottom electrodes (or storage nodes) are to be formed. Each of openings 19 may have a high aspect ratio. For example, each of the openings 19 may have an aspect ratio of at least 1:1 or higher. For example, the openings 19 may have a high aspect ratio of height-to-width of 10:1 or higher. The aspect ratio as used herein may refer to a ratio of height H to width W.

Subsequently, the etch stop layer 14 may be etched to expose the top surface of the cell contact plug 13 under the openings 19.

The mask layer for forming the openings 19 may include a hard mask material, a photoresist, or a combination thereof. The hard mask material may include amorphous silicon, an oxide, amorphous carbon, silicon oxynitride, or a combination thereof. In an embodiment, the photoresist may include argon fluoride (ArF) photoresist or extreme ultraviolet (EUV) photoresist.

The openings 19 may be formed by a double patterning process. For example, the mask layer for forming the openings 19 may have a mesh shape that is formed by combining the results of a spacer patterning process that is performed twice.

In an embodiment, a mold structure pattern including a plurality of openings 19 may be formed by a series of etching processes described above. The mold structure pattern may be a stack of the etch stop layer 14, the first mold layer 15, the first supporter layer 16, the second mold layer 17, and the second supporter layer 18.

The openings 19 may be formed in the memory cell region R1, and the openings 19 may be arranged in a high density. For example, the diameter of each of the openings 19 may be approximately 20 to 150 nm, and the gap between consecutive openings 19 may be approximately 20 to 50 nm.

Referring to FIG. 2C, a bottom electrode 20 may be formed in each of the openings 19. The bottom electrode 20 may fill the inside of the opening 19. The bottom electrode 20 may have a pillar shape. In order to form the pillar-shaped bottom electrode 20, a conductive material may be deposited to gap-fill the opening 19 and then a planarization process may be performed. The bottom electrode 20 may include, for example, polysilicon, a metal, a metal nitride, a conductive metal oxide, a metal silicide, a noble metal, or a combination thereof. The bottom electrode 20 may include at least one among titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide (RuO$_2$), iridium (Ir), iridium oxide (IrO$_2$), platinum (Pt), and combinations thereof. In this embodiment of the present invention, the bottom electrode 20 may include titanium nitride (TiN). The bottom electrode 20 may include titanium nitride (ALD-TiN) formed by atomic layer deposition (ALD). The bottom electrode 20 may include cylindrical titanium nitride and polysilicon filling the inside of the cylindrical titanium nitride.

According to another embodiment of the present invention, the bottom electrode 20 may include a stacked structure of titanium nitride and tungsten.

Referring to FIG. 2D, a supporter mask layer 21 may be formed. The supporter mask layer 21 may include, for example, photoresist or amorphous carbon. The supporter mask layer 21 may be patterned to be positioned in the memory cell region R1. The supporter mask layer 21 may not be positioned in the peripheral circuit region R2.

Subsequently, a portion of the second supporter layer 18 may be etched by using the supporter mask layer 21. An upper-level supporter opening 21S and an upper-level supporter 18S may be formed by etching the second supporter layer 18.

The upper-level supporter 18S may have a planar shape. The upper-level supporter 18S may contact the upper sidewall of the bottom electrodes 20. Some surfaces of the second mold layer 17 may be exposed by the upper-level supporter 18S. The upper-level supporter 18S may be shaped to partially surround the upper sidewall of the bottom electrodes 20. As described above, the upper-level supporter 18S may prevent the bottom electrodes 20 from collapsing in a subsequent process of removing the second mold layer 17.

In another embodiment, from the perspective of a top view, the upper-level supporter opening 21S may be shaped to partially expose the upper sidewalls of the three neighboring bottom electrodes 20. According to yet another embodiment of the present invention, the upper-level supporter opening 21S may be shaped to partially expose the upper sidewalls of at least four bottom electrodes 20. The cross section of the upper-level supporter opening 21S may have a triangular, square, parallelogram, pentagonal, hexagonal or honeycomb shape.

In yet another embodiment, the upper sidewalls of all the bottom electrodes 20 may be partially exposed by the upper-level supporter opening 21S. This may be referred to as an all-open bottom electrode array.

According to yet another embodiment of the present invention, the upper sidewall of at least one bottom electrode 20 may not be exposed by the upper-level supporter opening 21S. For example, there may be at least one bottom electrode 20 that is not exposed by the upper-level supporter opening 21S but fully covered by the upper-level supporter 18S among the bottom electrodes 20. This may be referred to as a 1-span bottom electrode array.

Referring to FIG. 2E, the second mold layer 17 under the upper-level supporter opening 21S may be selectively removed. As a result, the surface of the first supporter layer 16 may be exposed. A first wet dip-out process 22 may be performed to remove the second mold layer 17. The first wet dip-out process 22 may be performed using an etching solution capable of selectively removing the second mold layer 17. For example, when the second mold layer 17 includes silicon oxide, the second mold layer 17 may be removed by a wet etching process by using hydrofluoric acid (HF).

Referring to FIG. 2F, a portion of the first supporter layer 16 may be etched by using the supporter mask layer 21. For example, the first supporter layer 16 may be etched by a self-aligned etching process using the supporter mask layer 21 and the upper-level supporter 18S. A lower-level supporter opening 23 and a lower-level supporter 16S may be formed by etching the first supporter layer 16.

The lower-level supporter 16S may contact a portion sidewall of the bottom electrode 20. Some surfaces of the first mold layer 15 may be exposed by the lower-level supporter 16S. The lower-level supporter 16S may have a shape that partially surrounds the sidewall of the bottom electrodes 20 at a level lower than that of the upper-level supporter 16S. In this way, the lower-level supporter 16S may prevent the bottom electrodes 20 from collapsing in a subsequent process of removing the first mold layer 15.

Referring to FIG. 2G, the first mold layer 15 under the lower-level supporter opening 23 may be selectively removed. A second wet dip-out 22' may be performed to remove the first mold layer 15. The second wet dip-out 22' may be performed by using an etching solution capable of selectively removing the first mold layer 15. For example, when the first mold layer 15 includes silicon oxide, the first mold layer 15 may be removed by a wet etching process using hydrofluoric acid (HF). After the first mold layer 15 is removed, the supporter mask layer 21 may be stripped.

Through a series of processes described above, a lower-level supporter 16S and an upper-level supporter 18S supporting the walls of the bottom electrodes 20 may be formed. The lower-level supporter 16S and the upper-level supporter 18S may be formed in the memory cell region R1. The lower-level supporter 16S and the upper-level supporter 18S may protrude by extending further than the bottom electrodes 20 from an edge of the memory cell region R1 in the horizontal direction. The outer wall surface of the bottom electrodes 20 may be exposed, except for a portion contacting the lower-level supporter 16S and the upper-level supporter 18S.

Referring to FIG. 2H, a dielectric layer 24 may be formed over the bottom electrodes 20. The dielectric layer 24 may include a high-k material having a higher dielectric constant than silicon oxide. High-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer 24 may be formed of a composite layer including two or more layers of the high-k materials mentioned above. In this embodiment of the present invention, the dielectric layer 24 may be formed of a zirconium oxide-base material having good leakage current characteristics while sufficiently lowering the equivalent oxide film thickness (EOT). For example, ZAZ ($ZrO_2/Al_2O_3/ZrO_2$) may be included. According to another embodiment of the present invention, the dielectric layer 24 may include $TiO_2/ZrO_2/Al_2O_3/ZrO_2$, $TiO_2/HfO_2/Al_2O_3/HfO_2$, $Ta_2O_5/ZrO_2/Al_2O_3/ZrO_2$, or $Ta_2O_5/HfO_2/Al_2O_3/HfO_2$.

The bottom electrodes 20, the lower-level supporter 16S, the upper-level supporter 18S, and the dielectric layer 24 that are formed by a series of the processes described above may be collectively referred to as a 'lower array'. The lower array may have a structure including an upper portion and side portions on both sides of the upper portion. The lower array may further include an empty space between the bottom electrodes 20 and an empty space between the lower-level supporter 16S and the upper-level supporter 18S. The empty spaces in the lower array may be filled with portions of the subsequent top electrode TE. The lower array may be formed in the memory cell region R1 and may not be formed in the peripheral circuit region R2. The lower array may also be referred to as a 'capping target structure' that is capped by a subsequent top electrode TE.

Hereinafter, a method for forming a top electrode TE for capping the lower array will be described with reference to FIGS. 2I to 2P.

Referring to FIG. 2I, a liner layer 25 that becomes a portion of the top electrode may be formed over the dielectric layer 24. The liner layer 25 may include a metal-base material. The liner layer 25 may include a metal nitride. The liner layer 25 may include titanium nitride. The liner layer 25 may be referred to as a titanium nitride liner.

A gap-fill layer 26A, which becomes a portion of the top electrode, may be formed over the liner layer 25. The gap-fill layer 26A may fill the space between the bottom electrodes 20 over the liner layer 25. The gap-fill layer 26A and the liner layer 25 may be different materials. The gap-fill layer 26A may include a carbon-containing conductive material.

The gap-fill layer 26A may include carbon and silicon-containing materials. The gap-fill layer 26A may be silicon carbide. According to another embodiment of the present invention, the gap-fill layer 26A may include a seam (not shown) positioned between the bottom electrodes 20.

The gap-fill layer 26A may include an upper portion 26AT and a side portion 26AS. The upper portion 26AT of the gap-fill layer 26A may refer to a portion that is vertically positioned from the top surface of the bottom electrodes 20, and the side portion 26AS of the gap-fill layer 26A may refer to a portion that is positioned laterally from the outermost bottom electrode 20. The gap-fill layer 26A may cover the bottom electrodes 20 and the dielectric layer 24 over the liner layer 25. The side portion 26AS of the gap-fill layer 26A may be positioned at the edge portion of the memory cell region R1 and may include side protrusions 26P. The side protrusions 26P may have diverse shapes according to the shapes of the lower-level supporter 16S and the upper-level supporter 18S. The side portion 26AS of the gap-fill layer 26A may extend from the edge portion of the memory cell region R1 to cover the edge of the peripheral circuit region R2. The gap-fill layer 26A may further include an edge portion 26AL, and the edge portion 26AL of the gap-fill layer 26A may extend to cover the peripheral circuit region R2 as well as the edge portion of the memory cell region R1.

Referring to FIG. 2J, a capping layer 27A may be formed over the gap-fill layer 26A. The capping layer 27A may include a material having an etch selectivity with respect to the gap-fill layer 26. The capping layer 27A may include, for example, an oxide, a nitride, amorphous carbon, or a combination thereof. The capping layer 27A may be conformally formed according to the shape of the gap-fill layer 26. The capping layer 27A may cover both of the memory cell region R1 and the peripheral circuit region R2. The capping layer 27A may cover side protrusions 26P of the gap-fill layer 26A.

Referring to FIG. 2K, a mask layer 27M may be formed over the capping layer 27A. The mask layer 27M may be shaped to cover only the upper portion of the memory cell region R1. The mask layer 27M may include a photoresist pattern, amorphous carbon, an oxide or a nitride. The mask layer 27M may be a material having an etch selectivity with respect to the capping layer 27A and the gap-fill layer 26A.

Portions of the capping layer 27A may be exposed at the edge portion of the memory cell region R1 by the mask layer 27M. For example, side portions of the capping layer 27A may be exposed by the mask layer 27M.

The mask layer 27M may not be formed in the peripheral circuit region R2. The edge portion of the mask layer 27M may be positioned in the memory cell region R1 and may not extend into the peripheral circuit region R2. The edge portion of the mask layer 27M may be defined such that the capping layer 27A remains in the memory cell region R1 after a subsequent etching process. The edge portion of the mask layer 27M may have a size that exposes the edge portion of the memory cell region R1.

Subsequently, a pull-back process of the capping layer 27A may be performed. For example, side portions of the capping layer 27A may be etched by using the mask layer 27M. As a result, the capping portion 27 may be formed. The position of the edge portion of the capping portion 27 may be pulled back toward the memory cell region R1 to be closer to the memory cell region R1 than the position of the edge portion of the capping layer 27A.

The capping portion 27 may be shaped to cover only the upper portion of the memory cell region R1. The edge portion of the capping portion 27 may be positioned in the inside of the memory cell region R1 and may not extend into the peripheral circuit region R2. The edge portion of the capping portion 27 may be defined such that the gap-fill layer 26A remains in the memory cell region R1 after a subsequent etching process.

Portions of the gap-fill layer 26A may be exposed at the edge portion of the memory cell region R1 by the capping portion 27. For example, the side protrusions 26P and the side portion 26AS of the gap-fill layer 26A may be exposed by the capping portion 27.

Referring to FIG. 2L, the mask layer 27M may be removed.

Subsequently, a pull-back process of the gap-fill layer 26A may be performed. The pull-back process of the gap-fill layer 26A may be performed by a dry etching process. According to another embodiment of the present invention, the pull-back process of the gap-fill layer 26A may be performed by a wet etching process, such as a dip-out process. The side portion 26AS and the side protrusions 26P of the gap-fill layer 26A may be dry-etched by using the capping portion 27 as an etch barrier. The side protrusions 26P of the gap-fill layer 26A may be cut by etching the side portions of the gap-fill layer 26A. As a result, a gap-fill electrode 26 may be formed. The position of the side portion 26S of the gap-fill electrode 26 may be laterally pulled back toward the memory cell region R1 to be closer to the memory cell region R1 than the position of the side portion 26AS of the gap-fill layer 26A. According to another embodiment of the present invention, the pull-back process of the gap-fill layer 26A may be performed while the mask layer 27M remains, and in this case, the mask layer 27M may be removed after the pull-back process of the gap-fill layer 26A.

The gap-fill electrode 26 may include a gap-fill electrode upper portion 26T and a gap-fill electrode side portion 26S. The gap-fill electrode upper portion 26T may maintain the same thickness as the upper portion 26AT of the gap-fill layer 26A. The gap-fill electrode side portion 26S may have a thinner thickness than the side portion 26AS of the gap-fill layer 26A. The gap-fill electrode 26 may further include a gap-fill electrode edge bottom portion 26L, and the gap-fill electrode edge bottom portion 26L may have a thinner thickness than the edge portion 26AL of the gap-fill layer 26A.

Referring to FIG. 2M, the capping portion 27 may be removed. After the capping portion 27 is removed, the gap-fill electrode upper portion 26T may be exposed. The gap-fill electrode side portion 26S may include a first side portion S1 and a second side portion S2. The gap-fill electrode side portion 26S may further include a third side portion S3 and a fourth side portion S4. The first side portion S1 of the gap-fill electrode side portion 26S may be laterally positioned in the upper-level supporter 18S, and the third side portion S3 may be laterally positioned in the lower-level supporter 16S. The second side portion S2 of the gap-fill electrode side portion 26S may be a portion that fills the space between the upper-level supporter 18S and the lower-level supporter 16S over the liner electrode 25. The fourth side portion S4 of the gap-fill electrode side portion 26S may be a portion that fills the space between the lower-level supporter 16S and the etch stop layer 14 over the liner electrode 24.

The gap-fill electrode side portion 26S may have a vertical profile 26V. The gap-fill electrode side portion 26S may be positioned at the edge portion of the memory cell region R1 and may not be positioned at the edge portion of the peripheral circuit region R2.

The gap-fill electrode 26 may have a non-conformal shape. For example, the gap-fill electrode upper portion 26T may have a first thickness D1. The first side portion S1 of the gap-fill electrode side portion 26S may have a second thickness D2. The first thickness D1 may be thicker than the second thickness D2. The gap-fill electrode edge bottom portion 26L may have a third thickness D3, and the third thickness D3 may be thinner than the first thickness D1. The gap-fill electrode upper portion 26T may have a large thickness required to prevent deterioration of cell characteristics. Therefore, according to this embodiment of the present invention, the thickness of the gap-fill electrode side portion 26S may be selectively reduced without losing the first thickness D1 of the gap-fill electrode upper portion 26T. As a comparative example, when the thickness of the gap-fill electrode side portion 26S is thick, the size of the memory cell region R1 may be increased, which causes a reduction in the net die.

According to the embodiment of the present invention, since the gap-fill layer 26A is retreated by a pull-back process to form the gap-fill electrode 26, the edge portion of the top electrode may be reduced. The size of the memory cell region R1 may be reduced by reducing the thickness of the gap-fill electrode side portion 26S. This may increase the net die, improving productivity.

Referring to FIG. 2N, a low-resistivity electrode 28 may be formed over the gap-fill electrode 26. The low-resistivity electrode 28 may include a metal, a metal nitride, a conductive metal nitride, or a combination thereof. The low-resistivity electrode 28 may include titanium (Ti), titanium nitride (TiN), tantalum nitride (TaN), tungsten (W), tungsten nitride (WN), ruthenium, iridium, ruthenium oxide, iridium oxide, or a combination thereof. According to the embodiment of the present invention, the low-resistivity electrode 28 may be formed of tungsten nitride (WN).

As described above, the liner electrode 25, the gap-fill electrode 26, and the low-resistivity electrode 28 may be the top electrode of the capacitor.

The low-resistivity electrode 28 may cover the memory cell region R1 and the peripheral circuit region R2. The low-resistivity electrode 28 may not fill the space between the neighboring bottom electrodes 20.

Referring to FIG. 2O, a top electrode patterning process may be performed. In the top electrode patterning process, the low-resistivity electrode 28, the gap-fill electrode 26, and the liner electrode 25 may be sequentially etched by using the top electrode mask layer 29. The top electrode mask layer 29 may include a photoresist pattern. The top electrode mask layer 29 may be a mask for isolating the top electrode on the basis of a memory mat in the memory cell region R1.

The top electrode TE may be defined by the top electrode patterning process. The top electrode TE may include a stack of the liner electrode 25, the gap-fill electrode 26, and the low-resistivity electrode 28. The top electrode TE may include the top electrode edge bottom portion 26LE, and the top electrode edge bottom portion 26LE may not be positioned in the peripheral circuit region R2. The top electrode edge bottom portion 26LE may include a liner electrode edge bottom portion 25E, a gap-fill electrode edge bottom portion 26E, and a low-resistivity electrode edge bottom portion 28E. The gap-fill electrode edge bottom portion 26E and the liner electrode edge bottom portion 25E may be self-aligned perpendicularly to the low-resistivity electrode edge bottom portion 28E.

After the top electrode patterning process, the dielectric layer 24 may be removed from the peripheral circuit region R2. This may be referred to as dielectric layer cutting.

Referring to FIG. 2P, an upper-level inter-layer dielectric layer 30 may be formed over the top electrode TE. For example, the upper-level inter-layer dielectric layer 30 may include, for example, silicon oxide. The upper-level inter-layer dielectric layer 30 may remove a step that is formed between the memory cell region R1 and the peripheral circuit region R2. In order to remove the step, the upper surface of the upper-level inter-layer dielectric layer 30 may be planarized.

Subsequently, a first contact plug 31 and a second contact plug 32 penetrating the upper-level inter-layer dielectric layer 30 may be formed. The first contact plug 31 may be coupled to the low-resistivity electrode 28 of the top electrode TE, and the second contact plug 32 may be coupled to the lower level interconnection PM.

Upper level interconnections 33 may be formed on the respective top surfaces of the first and second contact plugs to be respectively coupled to the first and second contact plugs 31 and 32.

According to FIGS. 2A to 2P, a method for fabricating a semiconductor device may include: forming a lower array including a plurality of bottom electrodes 20, the lower/upper-level supporters 16S and 18S that support the bottom electrodes 20, and the dielectric layer 24 that is formed over the bottom electrodes 20 and the lower/upper-level supporters 16S and 18S over the memory cell region R1 of the semiconductor substrate 11 in which the memory cell region R1 and the peripheral circuit region R2 are defined; forming the liner layer 25 and the gap-fill layer 26A that cover the side portions and upper portion of the lower array; forming the capping portion 27 covering the upper portion of the lower array over the gap-fill layer 26A; performing a pull-back process of the gap-fill layer 26A to form the gap-fill electrode 26 aligned with the capping portion 27; forming the low-resistivity electrode 28 over the gap-fill electrode 26; and forming the second contact plug 32 that is physically spaced apart from the top electrode TE over the peripheral circuit region R2 which is spaced apart from the lower array. The gap-fill electrode 26 may further include the thin supporter-side side portions S1 and S3, which are close to the edge portion of the lower/upper supporters 16S and 18S, and the bottom electrode-side side portions S2 and S4, which extend from the supporter-side side portions S1 and S3. The bottom electrode-side side portions S2 and S4 may be thicker than the supporter-side side portions S1 and S3.

According to the above-described embodiment of the present invention, as the gap-fill electrode 26 is formed by the pull-back process, the distance L between the side portion (or edge portion) of the top electrode TE and the second contact plug 32 of the peripheral circuit region R2 may be spaced apart from each other sufficiently.

As a result, since the second contact plug 32 and the top electrode TE are sufficiently insulated from each other according to the embodiment of the present invention, an electrical short between the second contact plug 32 and the top electrode TE may be prevented. Also, miniaturization of the semiconductor device may be improved by reducing the size of the memory cell region R1.

Figure 3:
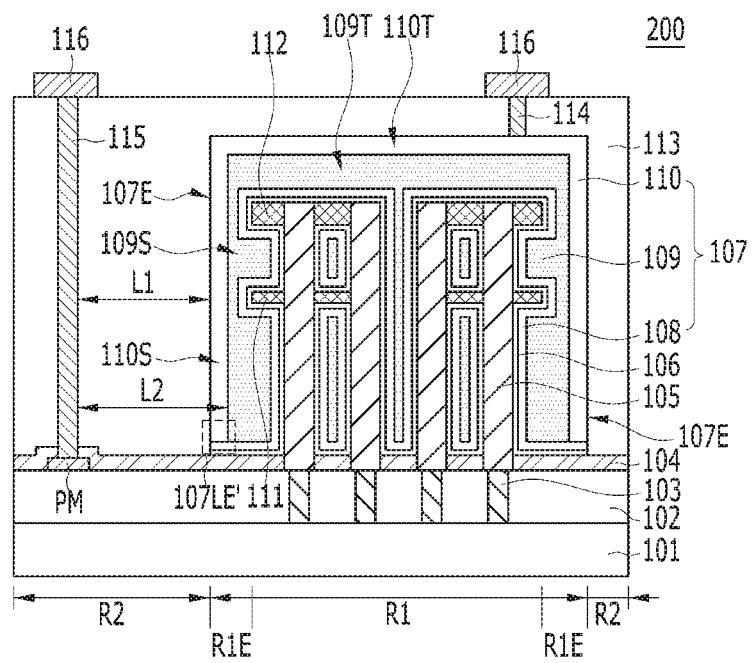
FIG. 3 is a cross-sectional view illustrating a semiconductor device in accordance with another embodiment of the present invention.

FIG. 3 is a cross-sectional view illustrating a semiconductor device 200 in accordance with another embodiment of the present invention. The semiconductor device 200 of FIG. 3 may be similar to the semiconductor device 100 of FIG. 1A. Hereinafter, detailed descriptions on the overlapping constituent elements will be omitted.

Referring to FIG. 3, the semiconductor device 200 may include a memory cell region R1 and a peripheral circuit region R2. A plurality of memory cells (not shown) may be formed spaced apart at a predetermined interval in the memory cell region R1.

A plurality of bottom electrodes 105 may be arranged in the memory cell region R1. Each of the bottom electrodes 105 may be electrically connected to a substrate 101 through a corresponding one of a plurality of cell contact plugs 103. The cell contact plugs 103 may penetrate through a lower-level inter-layer dielectric layer 102 formed over the substrate 101 to be coupled to the substrate 101. An etch stop layer 104 may be formed over the lower-level inter-layer dielectric layer 102, and a bottom portion of the bottom electrodes 105 may penetrate through the etch stop layer 104 to be coupled to their respective cell contact plugs 103.

The bottom electrodes 105 may be supported by at least one supporter, for example, supporters 111 or 112. The supporters 111 and 112 may form a multi-level structure with supporter 111 being a lower-level supporter and supporter 112 being an upper-level supporter 112. The upper-level supporter 112 may be positioned at a higher level than the lower-level supporter 111. The upper-level supporter 112 may support the upper outer wall of the bottom electrodes 105, and the lower-level supporter 111 may support the outer wall of the bottom electrodes 105 at a lower level than the upper-level supporter 112. The precise position of the upper-level supporter 112 and the lower-level supporter 111 may be variously modified.

A dielectric layer 106 may be formed to cover the exposed surfaces of the bottom electrodes 105, the lower-level supporter 111, and the upper-level supporter 112, and a top electrode 107 may be formed over the dielectric layer 106. The top electrode 107 may include a liner electrode 108, a gap-fill electrode 109, and a low-resistivity electrode 110. The liner electrode 108 may be conformally formed over the dielectric layer 106, and the gap-fill electrode 109 may gap-fill the space between the neighboring bottom electrodes 105 over the liner electrode 108, and the low-resistivity electrode 110 may cover the gap-fill electrode 109. The gap-fill electrode 109 may be embedded between the liner electrode 108 and the low-resistivity electrode 110. The gap-fill electrode 109 may not be formed between the neighboring bottom electrodes 105.

Referring to FIG. 3, the top electrode 107 may include top electrode edge portions 107E, and the top electrode edge portions 107E may be positioned at edge portions of the memory cell region R1. The top electrode edge portions 107E may be provided by low-resistivity electrode side portions 110S. The low-resistivity electrode side portions 110S may not be positioned in the peripheral circuit region R2. The top electrode edge portions 107E may include top electrode edge bottom portions 107LE'.

The gap-fill electrode 109 may fill the space between the bottom electrodes 105 over the liner electrode 108. The gap-fill electrode 109 may include a gap-fill electrode upper portion 109T and gap-fill electrode side portions 109S. The gap-fill electrode side portions 109S may extend from the gap-fill electrode upper portion 109T. The gap-fill electrode upper portion 109T may be positioned at a higher level than the bottom electrodes 105, and the gap-fill electrode side portions 109S may be a shape that is retreated by a pull-back process to be laterally spaced apart from the second contact plug 115.

Referring back to FIG. 1B, the gap-fill electrode side portions 109S may be positioned in the edge portions on both sides of the memory cell region R1, respectively. The gap-fill electrode side portions 109S may include a plurality of gap-fill electrode side portions S1, S2, S3, and S4. The gap-fill electrode side portions S1, S2, S3, and S4 may include a first gap-fill electrode side portion S1, a second gap-fill electrode side portion S2, a third gap-fill electrode side portion S3, and a fourth gap-fill electrode side portion S4. The first gap-fill electrode side portion S1 may cover the edge portion of the upper-level supporter 112, and the third gap-fill electrode side portion S3 may cover the edge portion of the lower-level supporter 112. The second gap-fill electrode side portion S2 may be positioned between the first gap-fill electrode side portion S1 and the third gap-fill electrode side portion S3 to be close to a side of the outermost bottom electrode 105 of the memory cell region R1. The fourth gap-fill electrode side portion S4 may be positioned between the third gap-fill electrode side portion S3 and the etch stop layer 104 to be close to a side of the outermost bottom electrode 105 of the memory cell region R1. The second gap-fill electrode side portion S2 and the fourth gap-fill electrode side portion S4 may extend from the first gap-fill electrode side portion S1 and the third gap-fill electrode side portion S3, respectively. The fourth gap-fill electrode side portion S4 may be positioned at a lower level than the lower-level supporter 111. The first gap-fill electrode side portion S1 and the third gap-fill electrode side portion S3 may be referred to as a supporter-side edge portion, and the second gap-fill electrode side portion S2 and the fourth gap-fill electrode side portion S4 may be referred to as a bottom electrode-side edge portion.

A thickness D2 of the first and second gap-fill electrode side portions S1 and S3 may be thinner than a thickness D1 of the gap-fill electrode upper portion 109T. The second and fourth gap-fill electrode side portions S2 and S4 may be thicker than the first and third gap-fill electrode side portions S1 and S3. The second and fourth gap-fill electrode side portions S2 and S4 may be thinner than the gap-fill electrode upper portion 109T. According to another embodiment of the present invention, the second and fourth gap-fill electrode side portions S2 and S4 may be as thick as or thicker than the gap-fill electrode upper portion 109T. The gap-fill electrode side portions 109S may have a vertical profile.

The gap-fill electrode 109 shown in FIG. 3 may not include a lateral edge portion 109E unlike the gap-fill electrode 109 shown in FIG. 1A. The top electrode edge bottom portions 107LE' may not include a lateral edge portion 109E.

The low-resistivity electrode 110 may include a low-resistivity electrode upper portion 110T covering the gap-fill electrode upper portion 109T and low-resistivity electrode side portions 110S that cover the gap-fill electrode side portions 109S. The low-resistivity electrode side portions 110S may fully cover the gap-fill electrode side portions 109S. As a result, the gap-fill electrode side portions 109S may be sealed out of the outside by the low-resistivity electrode 110 and the liner electrode 108. The low-resistivity electrode side portions 110S and the edge portion of the liner electrode 108 may be self-aligned vertically. The top electrode edge bottom portions 107LE' may not include a lateral edge portion 109E. The top electrode edge bottom portions 107LE' may be provided by the low-resistivity electrode side portions 110S and the edge bottom portion of the liner electrode 109.

FIGS. 4A to 4D are cross-sectional views illustrating an example of a method for fabricating a semiconductor device in accordance with another embodiment of the present invention.

First, a capping portion 27 may be formed by a series of processes illustrated in FIGS. 2A to 2K.

Figure 4A:
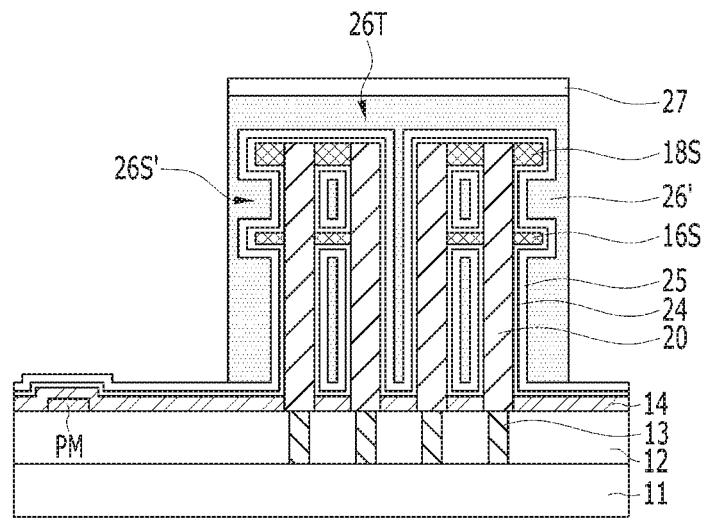
FIGS. 4A to 4D are cross-sectional views illustrating a method for fabricating a semiconductor device in accordance with another embodiment of the present invention.

Subsequently, as illustrated in FIG. 4A, a pull-back process of the gap-fill layer 26A may be performed. For example, the side portions 26AS of the gap-fill layer 26A may be etched by using the capping portion 27 as an etch barrier. The side protrusions 26P of the gap-fill layer 26A may be cut by etching the side portions 26AS of the gap-fill layer 26A. As a result, a gap-fill electrode 26' may be formed. The position of the edge portion of the gap-fill electrode 26' may be pulled back toward the memory cell region R1 to be closer to the memory cell region R1 than the position of the edge portion of the gap-fill layer 26A.

The gap-fill electrode 26' may include an upper portion 26T and a side portion 26S'. The upper portion 26T of the gap-fill electrode 26' may maintain the same thickness as the thickness of the upper portion 26AT of the gap-fill layer 26A. The side portion 26S' of the gap-fill electrode 26' may have a thickness thinner than the thickness of the side portion 26AS of the gap-fill layer 26A. Unlike the gap-fill electrode 26 shown in FIG. 2L, the gap-fill electrode 26' shown in FIG. 4A may not include an edge portion. For example, the pull-back process of the gap-fill layer 26A may be further performed such that the gap-fill electrode 26' includes only the side portion 26S. The side portion 26S' of FIG. 4A may be thinner than the side portion 26S of FIG. 2L.

Figure 4B:
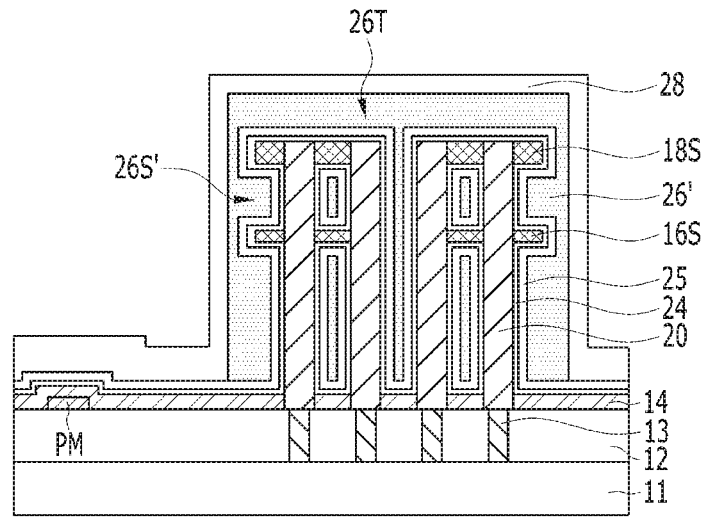

Referring to FIG. 4B, the capping portion 27 may be removed. As the capping portion 27 is removed, the upper portion 26T of the gap-fill electrode 26 may be exposed.

The side portion 26S' of the gap-fill electrode 26' may be positioned at the edge of the memory cell region R1 and may not be positioned at the edge of the peripheral circuit region R2.

Subsequently, a low-resistivity electrode 28 may be formed over the gap-fill electrode 26'. The low-resistivity electrode 28 may include a metal, a metal nitride, a conductive metal nitride, or a combination thereof. The low-resistivity electrode 28 may include titanium (Ti), titanium nitride (TiN), tantalum nitride (TaN), tungsten (W), tungsten nitride (WN), ruthenium, iridium, ruthenium oxide, iridium oxide, or a combination thereof. According to the embodiment of the present invention, the low-resistivity electrode 28 may be formed of tungsten nitride (WN).

As described above, the liner electrode 25, the gap-fill electrode 26', and the low-resistivity electrode 28 may be the top electrode of the capacitor.

The low-resistivity electrode 28 may cover the memory cell region R1 and the peripheral circuit region R2.

Figure 4C:
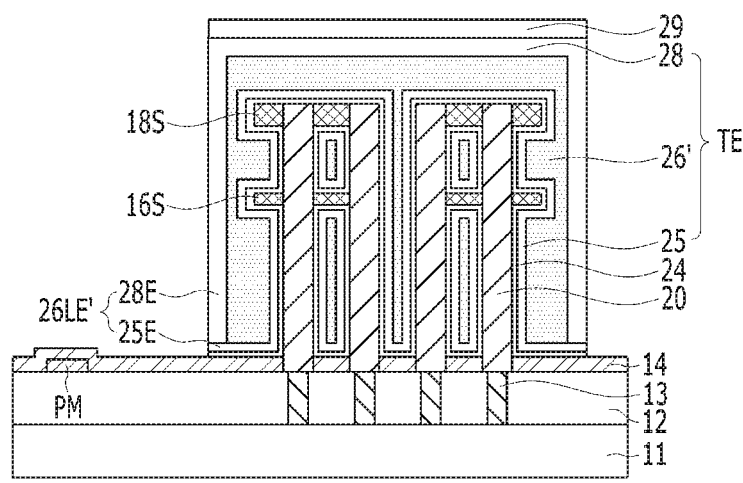

Referring to FIG. 4C, a top electrode patterning process may be performed. In the top electrode patterning process, the low-resistivity electrode 28, the gap-fill electrode 26', and the liner electrode 25 may be sequentially etched by using the top electrode mask layer 29. The top electrode mask layer 29 may include a photoresist pattern. The top electrode mask layer 29 may be a mask for separating the top electrode on the basis of a memory mat in the memory cell region R1.

The top electrode TE may be defined by the top electrode patterning process. The top electrode TE may include a stack of the liner electrode 25, the gap-fill electrode 26, and the low-resistivity electrodes 28. The top electrode TE may include the top electrode edge bottom portion 26LE', and the top electrode edge bottom portion 26LE' may not be positioned in the peripheral circuit region R2. The top electrode edge bottom portion 26LE' may include a liner electrode edge bottom portion 25E and a low-resistivity electrode edge bottom portion 28E. The liner electrode edge bottom portion 25E may be self-aligned perpendicularly to the low-resistivity electrode edge bottom portion 28E.

After the top electrode patterning process, the dielectric layer 24 may be removed from the peripheral circuit region R2. This may be referred to as dielectric layer cutting.

Figure 4D:
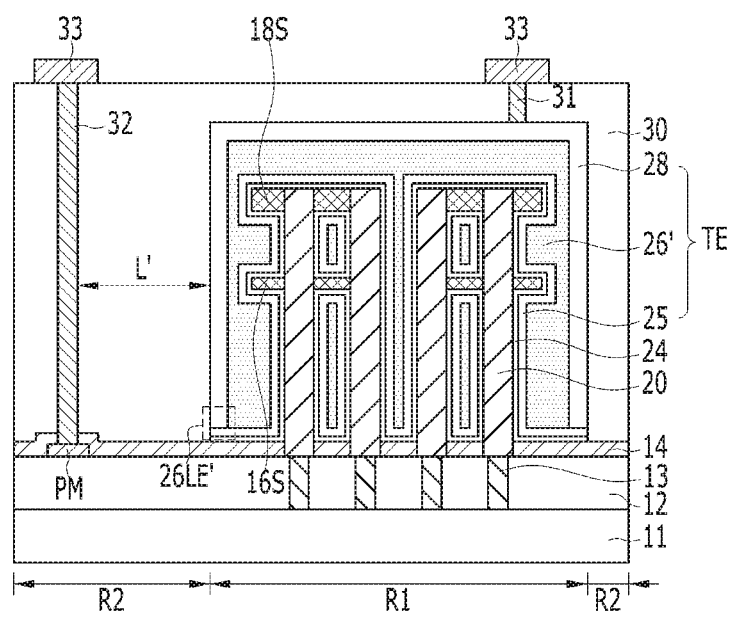

Referring to FIG. 4D, an upper-level inter-layer dielectric layer 30 may be formed over the top electrode TE. The upper-level inter-layer dielectric layer 30 may include, for example, silicon oxide. The upper-level inter-layer dielectric layer 30 may remove a step that is formed between the memory cell region R1 and the peripheral circuit region R2. In order to remove the step, the upper surface of the upper-level inter-layer dielectric layer 30 may be planarized.

Subsequently, a first contact plug 31 and a second contact plug 32 may be formed to penetrate through the upper-level inter-layer dielectric layer 30. The first contact plug 31 may be coupled to the low-resistivity electrode 28 of the top electrode TE, and the second contact plug 32 may be coupled to the lower level interconnection PM.

Upper level interconnections 33 may be formed to be respectively coupled to the first contact plug 31 and the second contact plug 32.

According to the above-described embodiment of the present invention, as the gap-fill electrode 26' is formed by the pull-back process, a distance L' between the side portion (or edge portion) of the top electrode TE and the second contact plug 32 of the peripheral circuit region R2 may be sufficiently spaced apart from each other.

As a result, since the second contact plug 32 and the top electrode TE are sufficiently insulated from each other, an electrical short between the second contact plug 32 and the top electrode TE may be prevented. Also, this may decrease the size of the memory cell region R1, thereby improving miniaturization of the semiconductor device.

Figure 5:
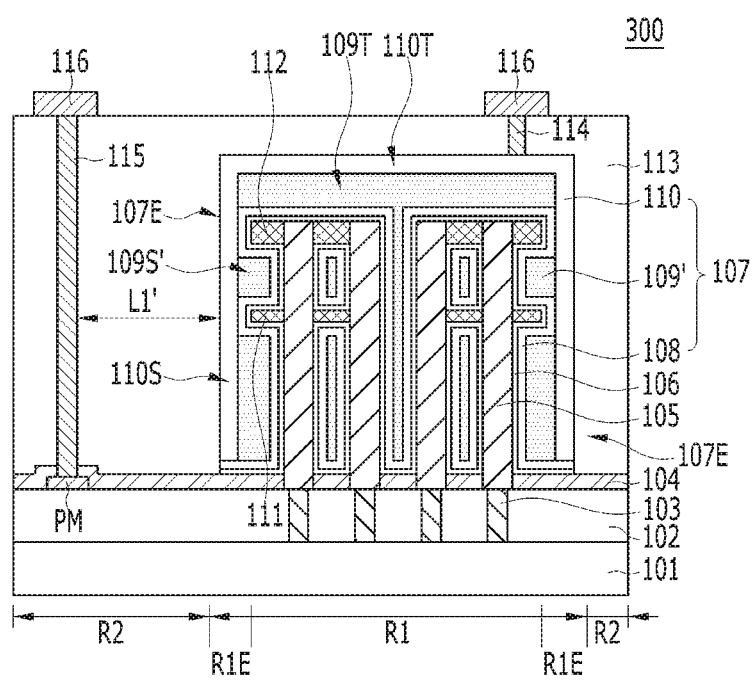
FIG. 5 is a cross-sectional view illustrating a semiconductor device in accordance with another embodiment of the present invention.

FIG. 5 is a cross-sectional view illustrating a semiconductor device 300 in accordance with another embodiment of the present invention. The semiconductor device 300 of FIG. 5 may be similar to the semiconductor device 100 shown in FIG. 1A. Hereinafter, detailed description on the overlapping constituent elements will be omitted.

Referring to FIG. 5, the semiconductor device 300 may include a memory cell region R1 and a peripheral circuit region R2. A plurality of memory cells (not shown) may be formed to be spaced apart at a predetermined interval in the memory cell region R1.

A plurality of bottom electrodes 105 may be arranged in the memory cell region R1. Each of the bottom electrodes 105 may be electrically connected to a substrate 101 through a corresponding one of a plurality of cell contact plugs 103. The cell contact plugs 103 may penetrate through the lower-level inter-layer dielectric layer 102 over the substrate 101 to be coupled to the substrate 101. An etch stop layer 104 may be formed over the lower-level inter-layer dielectric layer 102, and the bottom portion of the bottom electrodes 105 may penetrate through the etch stop layer 104 to be coupled to their respective cell contact plugs 103.

The bottom electrodes 105 may be supported by at least one supporter, e.g. supporters 111 or 112. The supporters 111 and 112 may form a multi-level structure with supporter 111 being a lower-level supporter and supporter 112 being an upper-level supporter. The upper-level supporter 112 may be positioned at a higher level than the lower-level supporter 111. The upper-level supporter 112 may support the upper outer wall of the bottom electrode 105, and the lower-level supporter 111 may support the outer wall of the bottom electrode 105 at a lower level than the upper-level supporter 112. The positions of the upper-level supporter 112 and the lower-level supporter 111 may be variously modified.

A dielectric layer 106 may be formed to cover the surfaces of the bottom electrodes 105, the lower-level supporter 111, and the upper-level supporter 112, and a top electrode 107 may be formed over the dielectric layer 106. The top electrode 107 may include a liner electrode 108, a gap-fill electrode 109', and a low-resistivity electrode 110. The liner electrode 108 may be formed conformally over the dielectric layer 106, and the gap-fill electrode 109' may gap-fill the space between the neighboring bottom electrodes 105 over the liner electrode 108, and the low-resistivity electrode 110 may cover the gap-fill electrode 109'. The gap-fill electrode 109' may be embedded between the liner electrode 108 and the low-resistivity electrode 110.

Referring to FIG. 5, the top electrode 107 may include top electrode edge portions 107E, and the top electrode edge portions 107E may be positioned in edge portions R1E of the memory cell region R1. The top electrode edge portions 107E may be provided by low-resistivity electrode side portions 110S. The low-resistivity electrode side portions 110S may not be positioned in the peripheral circuit region R2. The top electrode edge portions 107E may include top electrode edge bottom portions 107LE.

The gap-fill electrode 109' may fill the space between the bottom electrodes 105 over the liner electrode 108. The gap-fill electrode 109' may include a gap-fill electrode upper portion 109T and a gap-fill electrode side portions 109S'. The gap-fill electrode side portions 109S' may be discontinuous from the gap-fill electrode upper portion 109T. The gap-fill electrode upper portion 109T may be positioned at a higher level than the bottom electrodes 105, and the gap-fill electrode side portions 109S' may have a shape that is retreated by a pull-back process to be laterally spaced apart from the second contact plug 115.

The gap-fill electrode side portions 109S' may be positioned between the upper-level supporter 112 and the lower-level supporter 111. The gap-fill electrode side portions 109S' may be positioned at a lower level than the lower-level supporter 111.

The gap-fill electrode side portions 109S' may not be positioned on the side surfaces of the upper-level supporter 112 and the lower-level supporter 111. For example, the liner electrode 108 may be positioned between the low-resistivity electrode side portions 110S and the upper-level supporter 112, but the gap-fill electrode side portions 109S' may not be positioned between them. Also, the liner electrode 108 may be positioned between the low-resistivity electrode side portions 110S and the lower-level supporter 111, but the gap-fill electrode side portions 109S' may not be positioned between them.

As described above, the gap-fill electrode 109' of FIG. 5 may be more retreated toward the memory cell region R1 than the gap-fill electrode 109 of FIGS. 1A and 3. As a result, the size of the edge portion of the top electrode 107 may be further reduced. After all, the distance L1' between the edge portion (i.e., side portion) of the top electrode 107 and the second contact plug 115 of the peripheral circuit region R2 may be further increased as the gap-fill electrode 109' is further retreated. The distance L1' may be greater than the distance L1 shown in FIGS. 1A and 3.

Figure 6A:
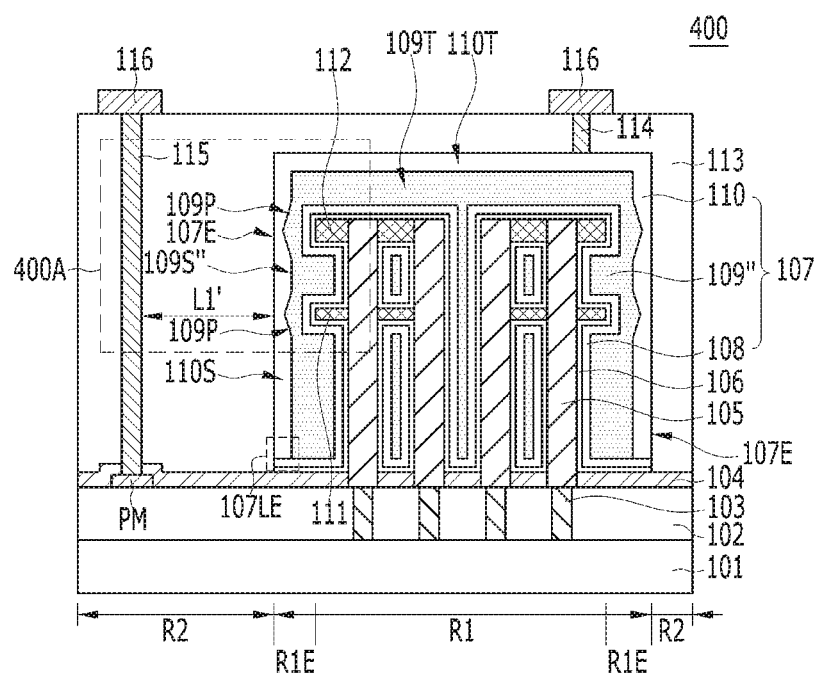
FIG. 6A is a cross-sectional view illustrating a semiconductor device in accordance with another embodiment of the present invention.
Figure 6B:
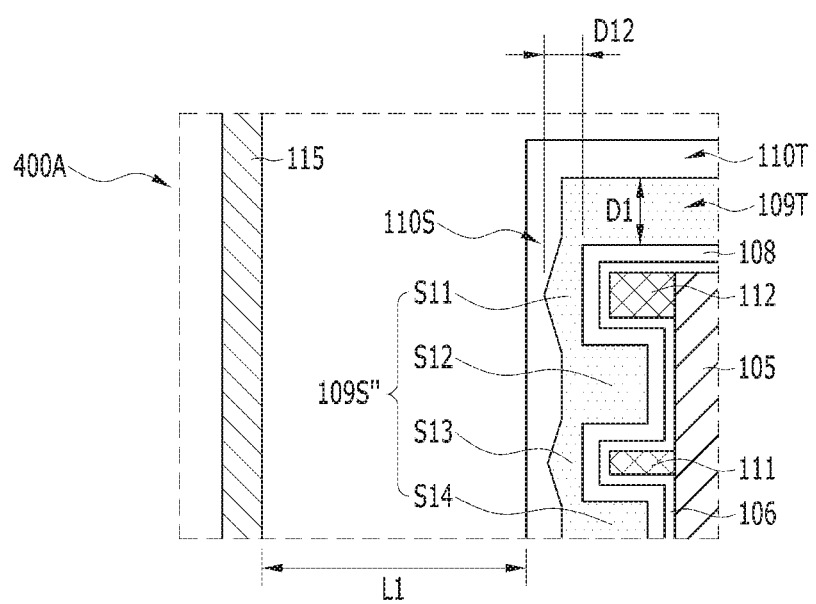
FIG. 6B is an enlarged view of a portion 400A shown in FIG. 6A.

FIG. 6A is a cross-sectional view illustrating a semiconductor device 400 in accordance with another embodiment of the present invention. The semiconductor device 400 of FIG. 6A may be similar to the semiconductor device 100 of FIG. 1A. Hereinafter, detailed description on the overlapping constituent elements will be omitted. FIG. 6B is an enlarged view of a portion 600A of FIG. 6A.

Referring to FIGS. 6A and 6B, the semiconductor device 400 may include a memory cell region R1 and a peripheral circuit region R2. A plurality of memory cells (not shown) may be formed to be spaced apart at a predetermined interval in the memory cell region R1.

A plurality of bottom electrodes 105 may be arranged in the memory cell region R1. Each of the bottom electrodes 105 may be electrically connected to a substrate 101 through a corresponding one of a plurality of cell contact plugs 103. The cell contact plugs 103 may penetrate through a lower-level inter-layer dielectric layer 102 over the substrate 101 to be coupled to the substrate 101. An etch stop layer 104 may be formed over the lower-level inter-layer dielectric layer 102, and the bottom portion of the bottom electrodes 105 may penetrate through the etch stop layer 104 to be coupled to their respective cell contact plugs 103.

The bottom electrodes 105 may be supported by at least one supporter, e.g. supporters 111 or 112. The supporters 111 and 112 may form a multi-level structure with supporter 111 being a lower-level supporter and supporter 112 being an upper-level supporter. The upper-level supporter 112 may be positioned at a higher level than the lower-level supporter 111. The upper-level supporter 112 may support the upper outer wall of the bottom electrode 105, and the lower-level supporter 111 may support the outer wall of the bottom electrode 105 at a lower level than the upper-level supporter 111. The positions of the upper-level supporter 112 and the lower-level supporter 111 may be variously modified.

A dielectric layer 106 may be formed to cover the surfaces of the bottom electrodes 105, the lower-level supporter 111, and the upper-level supporter 112, and a top electrode 107 may be formed over the dielectric layer 106. The top electrode 107 may include a liner electrode 108, a gap-fill electrode 109", and a low-resistivity electrode 110. The liner electrode 108 may be conformally formed over the dielectric layer 106. The gap-fill electrode 109" may gap-fill the space between the neighboring bottom electrode 105 over the liner electrode 108, and the low-resistivity electrode 110 may cover the gap-fill electrode 109". The gap-fill electrode 109" may be embedded between the liner electrode 108 and the low-resistivity electrode 110.

Referring to FIGS. 6A and 6B, the top electrode 107 may include top electrode edge portions 107E, and the top electrode edge portions 107E may be positioned at edge portions R1E of the memory cell region R1. The top electrode edge portions 107E may be provided by low-resistivity electrode side portions 110S. The low-resistivity electrode side portions 110S may not be positioned in the peripheral circuit region R2.

The gap-fill electrode 109" may fill the space between the bottom electrodes 105 over the liner electrode 108. The gap-fill electrode 109" may include a gap-fill electrode upper portion 109T and gap-fill electrode side portions 109S. The gap-fill electrode side portions 109S" may be continuous from the gap-fill electrode upper portion 109T. The gap-fill electrode upper portion 109T may be positioned at a higher level than the bottom electrodes 105, and the gap-fill electrode side portions 109S" may have a shape that is retreated by a pull-back process to be laterally spaced apart from the second contact plug 115.

The gap-fill electrode side portions 109S" may be positioned at both edge portions of the memory cell region R1. As illustrated in FIG. 6B, each of the gap-fill electrode side portions 109S" may include a plurality of gap-fill electrode side portions S11, S12, S13, and S14. The gap-fill electrode side portions S11, S12, S13, and S14 may include a first gap-fill electrode side portion S11, a second gap-fill electrode side portion S12, a third gap-fill electrode side portion S13, and a fourth gap-fill electrode side portion S14. The first gap-fill electrode side portion S11 may cover the edge portion of the upper-level supporter 112, and the third gap-fill electrode side portion S13 may cover the edge portion of the lower-level supporter 112. The second gap-fill electrode side portion S12 may be positioned between the first gap-fill electrode side portion S11 and the third gap-fill electrode side portion S13 to be close to a sidewall of the outermost bottom electrode 105 of the memory cell region R1. The fourth gap-fill electrode side portion S14 may be positioned between the third gap-fill electrode side portion S13 and the etch stop layer 104 to be close to a side of the outermost bottom electrode 105 of the memory cell region R1. The second gap-fill electrode side portion S12 and the fourth gap-fill electrode side portion S14 may extend from the first gap-fill electrode side portion S11 and the third gap-fill electrode side portion S13, respectively. The fourth gap-fill electrode side portion S14 may be positioned at a lower level than the lower-level supporter 111. The first gap-fill electrode side portion S11 and the third gap-fill electrode side portion S13 may be referred to as a supporter-side edge portion, and the second gap-fill electrode side portion S2 and the fourth gap-fill electrode side portion S4 may be referred to as a bottom electrode-side edge portion.

The thickness D12 of the first and second gap-fill electrode side portions S11 and S13 may be thinner than the thickness D1 of the gap-fill electrode upper portion 109T. The second and fourth gap-fill electrode side portions S12 and S14 may be thicker than the first and third gap-fill electrode side portions S11 and S13. The second and fourth gap-fill electrode side portions S12 and S14 may be thinner than the gap-fill electrode upper portion 109T. According to another embodiment of the present invention, the thickness of the second and fourth gap-fill electrode side portions S12 and S14 may be the same as or thicker than the thickness of the gap-fill electrode upper portion 109T.

The lateral length of the first and second gap-fill electrode side portions S11 and S13 may be longer than the lateral length of the first and fourth gap-fill electrode side portions S12 and S14. For example, the ends of the first and second gap-fill electrode side portions S11 and S13 may be shaped to protrude from the ends of the first and fourth gap-fill electrode side portions S12 and S14. The first and second gap-fill electrode side portions S11 and S13 may be referred to as protruding supporter-side edge portions.

The lateral length of the first and second gap-fill electrode side portions S11 and S13 may be longer than the lateral length of the first and third gap-fill electrode side portions S1 and S3 shown in FIG. 1B.

The first and second gap-fill electrode side portions S11 and S13 may be formed by an etch-back process of side protrusions 26P of the gap-fill layer 26A shown in FIG. 2K.

The gap-fill electrode side portions 109S" by the first and second gap-fill electrode side portions S11 and S13 may have a non-conformal surface.

According to the embodiments of the present invention, the edge portion of the top electrode may be reduced by retreating the gap-fill layer, which is a part of the top electrode, through a pull-back process. This may decrease the size of the memory cell region, thereby improving the net die.

Since the gap-fill layer, which is a part of the top electrode, is retreated by the pull-back process, it is possible to insulate the contact plug of the peripheral circuit region and the top electrode of the memory cell region from each other.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a lower array including a plurality of bottom electrodes over a semiconductor substrate, a supporter supporting the bottom electrodes, and a dielectric layer over the bottom electrodes and the supporter;
   forming a gap-fill layer covering side portions of the lower array and an upper portion of the lower array;
   forming a capping portion covering the upper portion of the lower array over the gap-fill layer;
   performing a pull-back process of the gap-fill layer to form a gap-fill electrode aligned with the capping portion; and
   forming a low-resistivity electrode over the gap-fill electrode,
   wherein the forming of the low-resistivity electrode over the gap-fill electrode includes:
   forming a low-resistivity layer covering the side portions of the lower array and the upper portion of the lower array over the semiconductor substrate including the gap-fill electrode; and
   etching the low-resistivity layer to cover the side portions of the lower array and the upper portion of the lower array over the gap-fill electrode.

2. The method of claim 1, wherein the gap-fill layer includes protrusions that cover the side portions of the lower array, and the protrusions are cut by the pull-back process.

3. The method of claim 1, wherein the gap-fill electrode further includes:
   thin supporter-side side portions covering an edge portion of the supporter; and
   bottom electrode-side side portions that extend from the supporter-side side portions,
   wherein the bottom electrode-side side portion are thicker than the supporter-side side portions.

4. The method of claim 1, wherein the pull-back process includes
   laterally etching the gap-fill layer by using the capping portion as an etch barrier.

5. The method of claim 1, wherein the pull-back process includes a dry etching process or a wet dip-out process.

6. The method of claim 1, wherein the gap-fill layer includes a semiconductor material.

7. The method of claim 1, wherein the gap-fill layer includes a silicon layer, a boron-doped silicon layer, a silicon germanium layer, a boron-doped silicon germanium layer, a silicon carbide, or a combination thereof.

8. The method of claim 1, wherein the capping portion includes a material having an etch selectivity with respect to the gap-fill layer.

9. The method of claim 1, wherein the capping portion includes silicon oxide, silicon nitride, amorphous carbon or a photoresist.

10. The method of claim 1, wherein the forming of the capping portion covering the upper portion of the lower array over the gap-fill layer includes:
    forming a capping material that conformally covers the side portions of the lower array and the upper portion of the lower array over the gap-fill layer;

forming a mask layer that masks the upper portion of the lower array over the capping material; and removing a portion of the capping material by using the mask layer as an etch barrier to form the capping portion over the lower array.

11. The method of claim 1, further comprising:

cutting a portion of the gap-fill electrode to be aligned with the low-resistivity electrode, after the etching of the low-resistivity layer to cover the side portions of the lower array and the upper portion of the lower array over the gap-fill electrode.

12. The method of claim 1, further comprising:

forming a contact plug that is physically spaced apart from the low-resistivity electrode in a region spaced apart from the lower array, after the forming of the low-resistivity electrode over the gap-fill electrode.

13. The method of claim 1, wherein the gap-fill electrode includes:

a gap-fill electrode upper portion covering the upper portion of the lower array; and gap-fill electrode side portions that extend from the gap-fill electrode upper portion to cover the side portions of the lower array, wherein the gap-fill electrode side portions have a vertical profile.

14. The method of claim 13, wherein the gap-fill electrode side portions are laterally retreated, compared with side portions of the gap-fill layer.

15. The method of claim 13, wherein the gap-fill electrode further includes a gap-fill electrode edge bottom portion that extends from the gap-fill electrode side portions, wherein the gap-fill electrode edge bottom portion is laterally retreated, compared with an edge portion of the gap-fill layer.

* * * * *